United States Patent
Fabiny

(10) Patent No.: US 12,222,445 B2
(45) Date of Patent: Feb. 11, 2025

(54) HIGH-RESOLUTION SOLID-STATE LIDAR TRANSMITTER

(71) Applicant: OPSYS TECH LTD., Holon (IL)

(72) Inventor: Larry Fabiny, Boulder, CO (US)

(73) Assignee: OPSYS TECH LTD., Holon (IL)

( * ) Notice: Subject to any disclaimer, the term of this patent is extended or adjusted under 35 U.S.C. 154(b) by 652 days.

(21) Appl. No.: 16/941,896

(22) Filed: Jul. 29, 2020

(65) Prior Publication Data
US 2021/0033708 A1 Feb. 4, 2021

Related U.S. Application Data

(60) Provisional application No. 62/881,354, filed on Jul. 31, 2019.

(51) Int. Cl.
*G01S 7/481* (2006.01)
*G01S 7/48* (2006.01)
*G01S 17/931* (2020.01)

(52) U.S. Cl.
CPC .......... *G01S 7/4815* (2013.01); *G01S 7/4808* (2013.01); *G01S 7/4817* (2013.01); *G01S 17/931* (2020.01)

(58) Field of Classification Search
CPC . H01S 5/18388; G02B 3/0056; G01S 7/4815; G01S 7/4808; G01S 7/4817; G01S 17/931; H01L 27/14627
See application file for complete search history.

(56) References Cited

U.S. PATENT DOCUMENTS

| | | | |
|---|---|---|---|
| 5,157,257 A | 10/1992 | Geiger | |
| 5,552,893 A | 9/1996 | Akasu | |
| 5,909,296 A | 6/1999 | Tsacoyeanes | |
| 6,057,909 A | 5/2000 | Yahav et al. | |
| 6,061,001 A | 5/2000 | Sugimoto | |

(Continued)

FOREIGN PATENT DOCUMENTS

| | | |
|---|---|---|
| CN | 1512946 A | 7/2004 |
| CN | 101013030 A | 8/2007 |

(Continued)

OTHER PUBLICATIONS

Non-Final Office Action received for U.S. Appl. No. 15/456,789 dated Sep. 25, 2019, 58 pages.

(Continued)

*Primary Examiner* — Luke D Ratcliffe
*Assistant Examiner* — Zhengqing Qi
(74) *Attorney, Agent, or Firm* — Rauschenbach Patent Law Group, PLLC; Kurt Rauschenbach

(57) ABSTRACT

A solid-state LIDAR transmitter includes a laser array comprising first and second laser pixels that each generate first and second sub-aperture beams. A first microlens focuses first and second sub-aperture beams generated by the first laser pixel and focuses first and second sub-aperture beams generated by the second laser pixel. A second microlens directs the first and second sub-aperture beams generated by the first pixel such that they overlap at a plane. A lens projects the first sub-aperture beam generated by the first laser pixel and the first sub-aperture beam generated by the second laser pixel with a different angle in the far field in order to achieve a desired spatial resolution of the LIDAR system.

14 Claims, 10 Drawing Sheets

(56) References Cited

U.S. PATENT DOCUMENTS

| | | |
|---|---|---|
| 6,246,708 B1 | 6/2001 | Thornton et al. |
| 6,353,502 B1 * | 3/2002 | Marchant ............ G02B 3/0056 |
| | | 359/619 |
| 6,680,788 B1 | 1/2004 | Roberson et al. |
| 6,717,972 B2 | 4/2004 | Steinle et al. |
| 6,775,480 B1 | 8/2004 | Goodwill |
| 6,788,715 B1 | 9/2004 | Leeuwen et al. |
| 6,829,439 B1 | 12/2004 | Sidorovich et al. |
| 6,860,350 B2 | 3/2005 | Beuhler et al. |
| 6,888,871 B1 | 5/2005 | Zhang et al. |
| 7,065,112 B2 | 6/2006 | Ghosh et al. |
| 7,110,183 B2 | 9/2006 | von Freyhold et al. |
| 7,544,945 B2 | 6/2009 | Tan et al. |
| 7,652,752 B2 | 1/2010 | Fetzer et al. |
| 7,702,191 B1 | 4/2010 | Geron et al. |
| 7,746,450 B2 | 6/2010 | Willner et al. |
| 7,773,204 B1 | 8/2010 | Nelson |
| 7,969,558 B2 | 6/2011 | Hall |
| 8,072,581 B1 | 12/2011 | Breiholz |
| 8,115,909 B2 | 2/2012 | Behringer et al. |
| 8,247,252 B2 | 8/2012 | Gauggel et al. |
| 8,301,027 B2 | 10/2012 | Shaw et al. |
| 8,576,885 B2 | 11/2013 | van Leeuwen et al. |
| 8,675,181 B2 | 3/2014 | Hall |
| 8,675,706 B2 | 3/2014 | Seurin et al. |
| 8,783,893 B1 | 7/2014 | Seurin et al. |
| 8,824,519 B1 | 9/2014 | Seurin et al. |
| 9,038,883 B2 | 5/2015 | Wang et al. |
| 9,048,633 B2 | 6/2015 | Gronenbom et al. |
| 9,268,012 B2 | 2/2016 | Ghosh et al. |
| 9,285,477 B1 | 3/2016 | Smith et al. |
| 9,348,018 B2 | 5/2016 | Eisele et al. |
| 9,360,554 B2 | 6/2016 | Retterath et al. |
| 9,378,640 B2 | 6/2016 | Mimeault et al. |
| 9,392,259 B2 | 7/2016 | Borowski |
| 9,516,244 B2 | 12/2016 | Borowski |
| 9,520,696 B2 | 12/2016 | Wang et al. |
| 9,553,423 B2 | 1/2017 | Chen et al. |
| 9,560,339 B2 | 1/2017 | Borowski |
| 9,574,541 B2 | 2/2017 | Ghosh et al. |
| 9,575,184 B2 | 2/2017 | Gilliland et al. |
| 9,658,322 B2 | 5/2017 | Lewis |
| 9,674,415 B2 | 6/2017 | Wan et al. |
| 9,791,557 B1 | 10/2017 | Wyrwas et al. |
| 9,841,495 B2 | 12/2017 | Campbell et al. |
| 9,857,468 B1 | 1/2018 | Eichenholz et al. |
| 9,933,513 B2 | 4/2018 | Dussan et al. |
| 9,946,089 B2 | 4/2018 | Chen et al. |
| 9,989,406 B2 | 6/2018 | Pacala et al. |
| 9,989,629 B1 | 6/2018 | LaChapelle |
| 9,992,477 B2 | 6/2018 | Pacala et al. |
| 10,007,001 B1 | 6/2018 | LaChapelle et al. |
| 10,063,849 B2 | 8/2018 | Pacala et al. |
| 10,191,156 B2 | 1/2019 | Steinberg et al. |
| 10,295,660 B1 | 5/2019 | McMichael et al. |
| 10,488,492 B2 | 11/2019 | Hamel et al. |
| 10,514,444 B2 | 12/2019 | Donovan |
| 10,761,195 B2 | 9/2020 | Donovan |
| 10,928,486 B2 | 2/2021 | Donovan |
| 11,016,178 B2 | 5/2021 | Donovan |
| 11,061,234 B1 | 7/2021 | Zhu et al. |
| 11,320,538 B2 | 5/2022 | Donovan et al. |
| 2002/0117340 A1 | 8/2002 | Stettner |
| 2002/0195496 A1 | 12/2002 | Tsikos |
| 2003/0043363 A1 | 3/2003 | Jamieson et al. |
| 2003/0123040 A1 * | 7/2003 | Almogy ............ G03F 7/70275 |
| | | 355/53 |
| 2003/0147652 A1 | 8/2003 | Green et al. |
| 2004/0120717 A1 | 6/2004 | Clark et al. |
| 2004/0228375 A1 | 11/2004 | Ghosh et al. |
| 2005/0025211 A1 | 2/2005 | Zhang et al. |
| 2005/0063428 A1 | 3/2005 | Anikitchecv et al. |
| 2005/0180473 A1 | 8/2005 | Brosnan |
| 2005/0232628 A1 | 10/2005 | von Freyhold et al. |
| 2006/0132752 A1 | 6/2006 | Kane |
| 2006/0231771 A1 | 10/2006 | Lee et al. |
| 2006/0244978 A1 | 11/2006 | Yamada et al. |
| 2007/0024849 A1 | 2/2007 | Carrig et al. |
| 2007/0071056 A1 | 3/2007 | Chen |
| 2007/0091960 A1 | 4/2007 | Gauggel et al. |
| 2007/0131842 A1 | 6/2007 | Ernst |
| 2007/0177841 A1 | 8/2007 | Dazinger |
| 2007/0181810 A1 | 8/2007 | Tan et al. |
| 2007/0219720 A1 | 9/2007 | Trepagnier et al. |
| 2008/0074640 A1 | 3/2008 | Walsh et al. |
| 2008/0186470 A1 | 8/2008 | Hipp |
| 2009/0027651 A1 | 1/2009 | Pack et al. |
| 2009/0140047 A1 | 6/2009 | Yu et al. |
| 2009/0161710 A1 | 6/2009 | Hoashi et al. |
| 2009/0273770 A1 | 11/2009 | Bauhahn et al. |
| 2009/0295986 A1 | 12/2009 | Topliss et al. |
| 2010/0046953 A1 | 2/2010 | Shaw et al. |
| 2010/0215066 A1 | 8/2010 | Mordaunt et al. |
| 2010/0271614 A1 | 10/2010 | Alburquerque et al. |
| 2010/0302528 A1 | 12/2010 | Hall |
| 2011/0176567 A1 | 7/2011 | Joseph |
| 2011/0216304 A1 | 9/2011 | Hall |
| 2012/0038903 A1 | 2/2012 | Weimer et al. |
| 2013/0163626 A1 | 6/2013 | Seurin et al. |
| 2013/0163627 A1 | 6/2013 | Seurin et al. |
| 2013/0206967 A1 | 8/2013 | Shpunt et al. |
| 2013/0208256 A1 | 8/2013 | Mamidipudi et al. |
| 2013/0208753 A1 | 8/2013 | van Leeuwen et al. |
| 2014/0043309 A1 | 2/2014 | Go et al. |
| 2014/0049610 A1 | 2/2014 | Hudman et al. |
| 2014/0071427 A1 | 3/2014 | Last |
| 2014/0111812 A1 | 4/2014 | Baeg et al. |
| 2014/0139467 A1 | 5/2014 | Ghosh et al. |
| 2014/0160341 A1 | 6/2014 | Tickoo et al. |
| 2014/0218898 A1 | 8/2014 | Seurin et al. |
| 2014/0247841 A1 | 9/2014 | Seurin et al. |
| 2014/0267701 A1 | 9/2014 | Aviv et al. |
| 2014/0303829 A1 | 10/2014 | Lombrozo et al. |
| 2014/0312233 A1 | 10/2014 | Mark et al. |
| 2014/0333995 A1 | 11/2014 | Seurin et al. |
| 2014/0350836 A1 | 11/2014 | Stettner et al. |
| 2014/0376092 A1 | 12/2014 | Mor |
| 2015/0055117 A1 | 2/2015 | Pennecot et al. |
| 2015/0069113 A1 | 3/2015 | Wang et al. |
| 2015/0097947 A1 | 4/2015 | Hudman et al. |
| 2015/0103358 A1 | 4/2015 | Flascher |
| 2015/0109603 A1 | 4/2015 | Kim et al. |
| 2015/0123995 A1 | 5/2015 | Zavodny et al. |
| 2015/0131080 A1 | 5/2015 | Retterath et al. |
| 2015/0160341 A1 | 6/2015 | Akatsu et al. |
| 2015/0219764 A1 | 8/2015 | Lipson |
| 2015/0255955 A1 | 9/2015 | Wang et al. |
| 2015/0260830 A1 | 9/2015 | Ghosh et al. |
| 2015/0260843 A1 | 9/2015 | Lewis |
| 2015/0311673 A1 | 10/2015 | Wang et al. |
| 2015/0316368 A1 | 11/2015 | Moench et al. |
| 2015/0340841 A1 | 11/2015 | Joseph |
| 2015/0362585 A1 | 12/2015 | Ghosh et al. |
| 2015/0377696 A1 | 12/2015 | Shpunt et al. |
| 2015/0378023 A1 | 12/2015 | Royo Royo et al. |
| 2016/0003946 A1 | 1/2016 | Gilliland et al. |
| 2016/0006914 A1 | 1/2016 | Neumann |
| 2016/0025842 A1 | 1/2016 | Anderson et al. |
| 2016/0025993 A1 | 1/2016 | Mor et al. |
| 2016/0033642 A1 | 2/2016 | Fluckiger |
| 2016/0072258 A1 | 3/2016 | Seurin et al. |
| 2016/0080077 A1 | 3/2016 | Joseph et al. |
| 2016/0119611 A1 | 4/2016 | Hall et al. |
| 2016/0161600 A1 | 6/2016 | Eldada et al. |
| 2016/0182891 A1 | 6/2016 | Ko et al. |
| 2016/0254638 A1 | 9/2016 | Chen et al. |
| 2016/0259038 A1 | 9/2016 | Retterath et al. |
| 2016/0266242 A1 | 9/2016 | Gilliland et al. |
| 2016/0274223 A1 | 9/2016 | Imai |
| 2016/0282468 A1 | 9/2016 | Gruver et al. |
| 2016/0291156 A1 | 10/2016 | Hjelmstad |
| 2016/0306358 A1 | 10/2016 | Kang et al. |
| 2016/0335778 A1 | 11/2016 | Smits |
| 2016/0348636 A1 | 12/2016 | Ghosh et al. |

(56) References Cited

U.S. PATENT DOCUMENTS

| | | |
|---|---|---|
| 2017/0003392 A1 | 1/2017 | Bartlett et al. |
| 2017/0026633 A1 | 1/2017 | Riza |
| 2017/0059838 A1 | 3/2017 | Tilleman |
| 2017/0115497 A1 | 4/2017 | Chen et al. |
| 2017/0131387 A1 | 5/2017 | Campbell et al. |
| 2017/0131388 A1 | 5/2017 | Campbell et al. |
| 2017/0139041 A1 | 5/2017 | Drader et al. |
| 2017/0153319 A1 | 6/2017 | Villeneuve et al. |
| 2017/0168162 A1 | 6/2017 | Jungwirth |
| 2017/0176579 A1 | 6/2017 | Niclass et al. |
| 2017/0219426 A1 | 8/2017 | Pacala et al. |
| 2017/0256915 A1 | 9/2017 | Ghosh et al. |
| 2017/0269209 A1 | 9/2017 | Hall et al. |
| 2017/0285169 A1 | 10/2017 | Holz |
| 2017/0289524 A1 | 10/2017 | Pacala et al. |
| 2017/0299722 A1 | 10/2017 | Cuiling et al. |
| 2017/0307736 A1* | 10/2017 | Donovan ............... G01S 7/499 |
| 2017/0307758 A1 | 10/2017 | Pei et al. |
| 2017/0350982 A1 | 12/2017 | Lipson |
| 2017/0353004 A1 | 12/2017 | Chen et al. |
| 2017/0356740 A1 | 12/2017 | Ansari et al. |
| 2018/0045816 A1 | 2/2018 | Jarosinski et al. |
| 2018/0058923 A1 | 3/2018 | Lipson et al. |
| 2018/0059222 A1 | 3/2018 | Pacala et al. |
| 2018/0062345 A1 | 3/2018 | Bills et al. |
| 2018/0068458 A1 | 3/2018 | Wan et al. |
| 2018/0074198 A1 | 3/2018 | Von Novak et al. |
| 2018/0107221 A1 | 4/2018 | Droz et al. |
| 2018/0113200 A1 | 4/2018 | Steinberg et al. |
| 2018/0113208 A1 | 4/2018 | Bergeron et al. |
| 2018/0120441 A1 | 5/2018 | Elooz et al. |
| 2018/0128920 A1 | 5/2018 | Keilaf et al. |
| 2018/0136335 A1 | 5/2018 | Kare et al. |
| 2018/0152691 A1 | 5/2018 | Pacala et al. |
| 2018/0167602 A1 | 6/2018 | Pacala et al. |
| 2018/0180720 A1 | 6/2018 | Pei et al. |
| 2018/0180721 A1 | 6/2018 | Pei et al. |
| 2018/0180722 A1 | 6/2018 | Pei et al. |
| 2018/0203247 A1 | 7/2018 | Chen et al. |
| 2018/0209841 A1 | 7/2018 | Pacala et al. |
| 2018/0217236 A1 | 8/2018 | Pacala et al. |
| 2018/0259623 A1 | 9/2018 | Donovan |
| 2018/0259624 A1 | 9/2018 | Kiehn et al. |
| 2018/0259645 A1 | 9/2018 | Shu et al. |
| 2018/0269646 A1 | 9/2018 | Welford et al. |
| 2018/0275248 A1 | 9/2018 | Bailey et al. |
| 2018/0299552 A1 | 10/2018 | Shu et al. |
| 2018/0301872 A1 | 10/2018 | Burroughs et al. |
| 2018/0301874 A1 | 10/2018 | Burroughs et al. |
| 2018/0301875 A1 | 10/2018 | Burroughs et al. |
| 2018/0364334 A1 | 12/2018 | Xiang et al. |
| 2018/0364356 A1 | 12/2018 | Eichenholz et al. |
| 2019/0003429 A1 | 1/2019 | Miyashita |
| 2019/0004156 A1 | 1/2019 | Niclass et al. |
| 2019/0011561 A1 | 1/2019 | Pacala et al. |
| 2019/0011562 A1 | 1/2019 | Pacala et al. |
| 2019/0011567 A1 | 1/2019 | Pacala et al. |
| 2019/0018115 A1 | 1/2019 | Schmitt et al. |
| 2019/0036308 A1 | 1/2019 | Carson et al. |
| 2019/0049097 A1* | 2/2019 | Rossi ..................... F21V 14/06 |
| 2019/0049662 A1 | 2/2019 | Thomsen et al. |
| 2019/0056497 A1 | 2/2019 | Pacala et al. |
| 2019/0064355 A1* | 2/2019 | Pacala ................... G01S 17/931 |
| 2019/0094346 A1 | 3/2019 | Dumoulin et al. |
| 2019/0098233 A1 | 3/2019 | Gassend et al. |
| 2019/0137607 A1 | 5/2019 | Kostamovaara |
| 2019/0146071 A1 | 5/2019 | Donovan |
| 2019/0170855 A1 | 6/2019 | Keller et al. |
| 2019/0178974 A1 | 6/2019 | Droz |
| 2019/0179018 A1 | 6/2019 | Gunnam et al. |
| 2019/0293954 A1 | 9/2019 | Lin et al. |
| 2019/0302246 A1 | 10/2019 | Donovan et al. |
| 2020/0018835 A1 | 1/2020 | Cepton |
| 2020/0041614 A1 | 2/2020 | Donovan et al. |
| 2020/0081101 A1 | 3/2020 | Donovan |
| 2020/0124732 A1 | 4/2020 | Sutherland et al. |
| 2020/0200874 A1 | 6/2020 | Donovan |
| 2020/0209355 A1 | 7/2020 | Pacala et al. |
| 2020/0278426 A1 | 9/2020 | Dummer et al. |
| 2020/0326425 A1 | 10/2020 | Donovan et al. |
| 2020/0379088 A1 | 12/2020 | Donovan et al. |
| 2020/0386868 A1 | 12/2020 | Donovan et al. |
| 2020/0408908 A1 | 12/2020 | Donovan |
| 2021/0041567 A1 | 2/2021 | Milgrome et al. |
| 2021/0157000 A1 | 5/2021 | Imaki |
| 2021/0181311 A1 | 6/2021 | Donovan |
| 2021/0231779 A1 | 7/2021 | Donovan |
| 2021/0231806 A1 | 7/2021 | Donovan et al. |
| 2021/0234342 A1 | 7/2021 | Donovan |
| 2021/0278540 A1 | 9/2021 | Maayan et al. |
| 2021/0321080 A1 | 10/2021 | Jeong et al. |
| 2022/0146680 A1 | 5/2022 | Donovan et al. |

FOREIGN PATENT DOCUMENTS

| | | |
|---|---|---|
| CN | 101080733 A | 11/2007 |
| CN | 101545582 A | 9/2009 |
| CN | 103633557 A | 3/2014 |
| CN | 104898125 A | 9/2015 |
| CN | 105705964 A | 6/2016 |
| CN | 106291575 A | 1/2017 |
| CN | 106464366 A | 2/2017 |
| CN | 109073757 A | 12/2018 |
| CN | 109863445 A | 6/2019 |
| CN | 107728156 A | 11/2019 |
| CN | 110402398 A | 11/2019 |
| CN | 110914702 A | 3/2020 |
| CN | 111356934 A | 6/2020 |
| CN | 111919137 A | 11/2020 |
| CN | 112543875 A | 3/2021 |
| CN | 113692540 A | 11/2021 |
| CN | 113906316 A | 1/2022 |
| CN | 113924506 A | 1/2022 |
| CN | 114096882 A | 2/2022 |
| CN | 114174869 A | 3/2022 |
| DE | 197 17 399 A1 | 6/1999 |
| DE | 10103861 A1 | 8/2001 |
| DE | 102007004609 A1 | 8/2007 |
| DE | 102014216390 A1 | 2/2016 |
| DE | 102019005059 A1 | 2/2020 |
| EP | 1160540 A1 | 12/2001 |
| EP | 1444696 B1 | 3/2005 |
| EP | 1569007 A2 | 8/2005 |
| EP | 2656099 A1 | 12/2011 |
| EP | 2656106 A1 | 12/2011 |
| EP | 2775316 A2 | 9/2014 |
| EP | 3168641 B1 | 4/2016 |
| EP | 3054313 A1 | 8/2016 |
| EP | 3497477 A1 | 8/2016 |
| EP | 2656100 A1 | 10/2016 |
| EP | 3526625 A1 | 11/2016 |
| EP | 3 159 711 A1 | 4/2017 |
| EP | 3446153 A2 | 2/2019 |
| EP | 3596492 A1 | 1/2020 |
| EP | 3658949 A1 | 6/2020 |
| EP | 3710855 A2 | 9/2020 |
| EP | 3775979 A1 | 2/2021 |
| EP | 3830602 A1 | 6/2021 |
| EP | 3953727 A1 | 2/2022 |
| EP | 3977159 A1 | 4/2022 |
| EP | 3980808 A1 | 4/2022 |
| EP | 3990943 A1 | 5/2022 |
| EP | 4004587 A1 | 6/2022 |
| FR | 2816264 A1 | 5/2002 |
| JP | H05-243552 A | 9/1993 |
| JP | 7-253460 | 10/1995 |
| JP | 8-280173 A | 10/1996 |
| JP | H10-126007 A | 5/1998 |
| JP | 2000-147604 A | 5/2000 |
| JP | 2002-214361 A | 7/2002 |
| JP | 2003258359 A | 9/2003 |
| JP | 2003-536061 | 12/2003 |
| JP | 2004-078255 A | 3/2004 |
| JP | 2004-94115 | 3/2004 |

(56) References Cited

FOREIGN PATENT DOCUMENTS

| | | |
|---|---|---|
| JP | 2004-361315 A | 12/2004 |
| JP | 2005-331273 A | 12/2005 |
| JP | 2006-162386 A | 6/2006 |
| JP | 2007-058163 A | 3/2007 |
| JP | 2007-214564 | 8/2007 |
| JP | 2008-015434 A | 1/2008 |
| JP | 4108478 B2 | 6/2008 |
| JP | 2008-180719 A | 8/2008 |
| JP | 2009-103529 | 5/2009 |
| JP | 2009-170870 A | 7/2009 |
| JP | 2009-204691 | 9/2009 |
| JP | 2010-91855 | 4/2010 |
| JP | 2010-256291 A | 11/2010 |
| JP | 2011-003748 A | 1/2011 |
| JP | 2012-504771 A | 2/2012 |
| JP | 5096008 | 12/2012 |
| JP | 2013-050310 A | 3/2013 |
| JP | 2013-113669 A | 6/2013 |
| JP | 2013-530380 A | 7/2013 |
| JP | 2014-059302 A | 4/2014 |
| JP | 2014-077658 A | 5/2014 |
| JP | 2015-055739 A | 3/2015 |
| JP | 2016-146417 | 8/2016 |
| JP | 2016-176721 A | 10/2016 |
| JP | 2016-188808 A | 11/2016 |
| JP | 2016-540189 A | 12/2016 |
| JP | 2017-053833 A | 3/2017 |
| JP | 2017-134814 A | 8/2017 |
| JP | 2017-527222 A | 9/2017 |
| JP | 2018-025632 A | 2/2018 |
| JP | 2018-511034 A | 4/2018 |
| JP | 2018-527588 A | 9/2018 |
| JP | 2018-164089 A | 10/2018 |
| JP | 2019-060652 A | 4/2019 |
| JP | 2019-68528 A | 4/2019 |
| JP | 2019-509474 A | 4/2019 |
| JP | 2019-516101 A | 6/2019 |
| JP | 2020-510208 A | 4/2020 |
| JP | 2021-503085 A | 2/2021 |
| JP | 2021-507260 A | 2/2021 |
| JP | 6839861 B2 | 3/2021 |
| JP | 6865492 B2 | 4/2021 |
| JP | 2021-073462 A | 5/2021 |
| JP | 2021-073473 A | 5/2021 |
| JP | 2021-105613 A | 7/2021 |
| JP | 2021-519926 A | 8/2021 |
| JP | 2021-139918 A | 9/2021 |
| JP | 2021-532368 A | 11/2021 |
| JP | 2022-001885 A | 1/2022 |
| JP | 6995413 B2 | 1/2022 |
| JP | 2022-022361 A | 2/2022 |
| JP | 2022-036224 A | 3/2022 |
| JP | 7037830 B2 | 3/2022 |
| JP | 2022-526998 A | 5/2022 |
| JP | 2022-534500 A | 8/2022 |
| KR | 10-2000-0053620 A | 8/2000 |
| KR | 10-2009-0016499 A | 2/2009 |
| KR | 10-2011-0111090 A | 10/2011 |
| KR | 10-2012-0053045 A | 5/2012 |
| KR | 10-2012-0061033 A | 6/2012 |
| KR | 10-2013-014055 A | 12/2013 |
| KR | 10-2014-0138724 | 12/2014 |
| KR | 10-2015-0045735 A | 4/2015 |
| KR | 10-2016-0101140 A | 8/2016 |
| KR | 10-2018-0049937 A | 5/2018 |
| KR | 10-2018-0064969 A | 6/2018 |
| KR | 10-2018-0128447 A | 12/2018 |
| KR | 10-2019-0076725 A | 7/2019 |
| KR | 10-2019-0117418 A | 10/2019 |
| KR | 10-2019-0120403 A | 10/2019 |
| KR | 10-2020-0011351 A | 2/2020 |
| KR | 10-2020-0075014 A | 6/2020 |
| KR | 10-2020-0096632 A | 8/2020 |
| KR | 10-2020-0128435 A | 11/2020 |
| KR | 10-2021-0021409 A | 2/2021 |
| KR | 102218679 B1 | 2/2021 |
| KR | 10-2021-0029831 A | 3/2021 |
| KR | 10-2021-0065207 A | 6/2021 |
| KR | 10-2021-0137584 A | 11/2021 |
| KR | 10-2021-0137586 A | 11/2021 |
| KR | 102326493 B1 | 11/2021 |
| KR | 102326508 B1 | 11/2021 |
| KR | 10-2022-0003600 A | 1/2022 |
| KR | 10-2022-0017412 A | 2/2022 |
| KR | 102364531 B1 | 2/2022 |
| KR | 10-2022-0024177 A | 3/2022 |
| KR | 10-2022-0025924 A | 3/2022 |
| KR | 10-2022-0038691 A | 3/2022 |
| KR | 10-2398080 B1 | 5/2022 |
| WO | 99-42856 A1 | 8/1999 |
| WO | 2002/065153 A1 | 8/2002 |
| WO | 2006/044758 A2 | 4/2006 |
| WO | 2006/083349 A2 | 8/2006 |
| WO | 2013107709 A1 | 7/2013 |
| WO | 2014/014838 A2 | 1/2014 |
| WO | 2015/040671 A1 | 3/2015 |
| WO | 2015040671 | 3/2015 |
| WO | 2015/059705 A1 | 4/2015 |
| WO | 2016/122404 A1 | 8/2016 |
| WO | 2017/112416 A1 | 6/2017 |
| WO | 2017/132704 A1 | 8/2017 |
| WO | 2017/184336 A2 | 10/2017 |
| WO | 2018028795 A1 | 2/2018 |
| WO | 2018/050337 A1 | 3/2018 |
| WO | 2018082762 A1 | 5/2018 |
| WO | 2018/167215 A | 9/2018 |
| WO | 2018/169758 A1 | 9/2018 |
| WO | 2018166609 A1 | 9/2018 |
| WO | 2018166610 A1 | 9/2018 |
| WO | 2018166611 A1 | 9/2018 |
| WO | 2018169758 | 9/2018 |
| WO | 2018/180391 A1 | 10/2018 |
| WO | 2018/181250 A1 | 10/2018 |
| WO | 2018/191495 A1 | 10/2018 |
| WO | 2019/010320 A1 | 1/2019 |
| WO | 2019/022941 A1 | 1/2019 |
| WO | 2019-064062 A1 | 4/2019 |
| WO | 2019115148 A1 | 6/2019 |
| WO | 2019/195054 A1 | 10/2019 |
| WO | 2019/221776 A2 | 11/2019 |
| WO | 2020/028173 A1 | 2/2020 |
| WO | 2020/210176 A1 | 10/2020 |
| WO | 2020/242834 A1 | 12/2020 |
| WO | 2020/251891 A1 | 12/2020 |
| WO | 2020/263735 A1 | 12/2020 |
| WO | 2021/021872 A1 | 2/2021 |
| WO | 2021/150860 A1 | 7/2021 |
| WO | 2021/236201 A2 | 11/2021 |
| WO | 2022/103778 A1 | 5/2022 |

OTHER PUBLICATIONS

Notice of Allowance received for U.S. Appl. No. 15/456,789 dated Apr. 29, 2020, 45 pages.

Notification of Transmittal of the International Search Report and The Written Opinion of the International Searching Authority, or the Declaration, for International Application No. PCT/US2017/026109, Jun. 19, 2017, 15 pages, International Search Authority/Korean Intellectual Property Office, Daejeon, Republic of Korea.

Notification of Transmittal of the International Search Report and The Written Opinion of the International Searching Authority, or the Declaration for International Patent Application No. PCT/US2018/021553, Jun. 20, 2018, 13 pages, International Searching Authority, Korean Intellectual Property Office, Daejeon, Republic of Korea.

Notification Concerning Transmittal of International Preliminary Report on Patentability (Chapter 1 of The Patent Cooperation Treaty) for International Patent Application No. PCT/US2017/026109, Nov. 1, 2018, 13 Pages, The International Bureau of WIPO, Geneva, Switzerland.

Notification of Transmittal of The International Search Report and The Written Opinion of The International Searching Authority, or The Declaration for International Patent Application No. PCT/

(56) References Cited

OTHER PUBLICATIONS

US2018/041021, Nov. 5, 2018, 13 Pages, Korean Intellectual Property Office, Daejeon, Republic of Korea.
Notification of Transmittal of the International Search Report and the Written Opinion of the International Searching Authority, or the Declaration for International Patent Application No. PCT/US2019/024343, Jul. 12, 2019, 15 Pages, SA/KR, Korean Intellectual Property Office, Daejeon, Republic of Korea.
Notification Concerning Transmittal of International Preliminary Report on Patentability (Chapter I of the Patent Cooperation Treaty) for International Patent Application No. PCT/US2018/021553, Sep. 26, 2019, 9 Pages, The International Bureau of WIPO, Geneva, Switzerland.
Notification of Transmittal of the International Search Report and the Written Opinion of the International Searching Authority, or the Declaration for International Patent Application No. PCT/US2019/043674, Nov. 15, 2019, 16 pages, International Searching Authority/KR, Daejeon, Republic of Korea.
"Supplementary European Search Report" for European Patent Application No. 17786325.5, Nov. 7, 2019, 17 pages, European Patent Office, Munich, Germany.
Notification of Transmittal of The International Search Report and The Written Opinion of the International Searching Authority, or The Declaration for International Patent Application No. PCT/US2018/057026, Dec. 16, 2019, 11 pages, International Searching Authority, Korean Intellectual Property Office, Daejeon, Republic of Korea.
Notification Concerning Transmittal of International Preliminary Report on Patentability (Chapter I of the Patent Cooperation Treaty) for International Application No. PCT/US18/041021, Feb. 6, 2020, 10 pages, The International Bureau of WIPO, Geneva, Switzerland.
"Extended European Search Report" for European Patent Application No. 17786325.5, Mar. 11, 2020, 22 pages, European Patent Office, Munich, Germany.
"Notice of Allowance" for Japanese Patent Application No. 2018-555665, Dec. 2, 2020, 05 pages, Japanese Patent Office, Japan (Including English Translation).
Notification of Reason for Refusal received for JP Patent Application No. 2021-014376, Sep. 27, 2021, 16 pages (Including English Translation).
Non-Final Office Action received for U.S. Appl. No. 15/915,840 dated May 7, 2020, 100 pages.
Notice of Allowance received for U.S. Appl. No. 15/915,840 dated Jan. 19, 2021, 40 pages.
"Extended Search Report" for European Patent Application No. 18767885.9, Nov. 18, 2020, 10 pages, European Patent Office, Munich, Germany.
"Japanese Office Action" for Japanese Patent Application No. 2019-549550, Mar. 22, 2021, 2 pages, Japanese Patent Office, Japan (Including English Translation).
"Notice of Preliminary Rejection" for South Korean Patent Application No. 10-2019-7029980, 4 pages, Mar. 26, 2021, Korean Intellectual Property Office, South Korea (Including English Translation).
"Notice of Grant" for Korean Patent Application No. 10-2019-7029980, 2 pages, Aug. 6, 2021, The Korean Intellectual Property Office, South Korea (Including English Translation).
Final Office Action received for JP Patent Application No. 2019-549550, mailed on Aug. 27, 2021, 7 pages (5 pages of English Translation and 2 pages of Official Copy).
Notice of Allowance received for U.S. Appl. No. 16/028,774 dated Aug. 21, 2019, 56 pages.
Non-Final Rejection received for U.S. Appl. No. 16/686,163 dated Apr. 16, 2020, 99 pages.
Notice of Allowance received for U.S. Appl. No. 16/686,163 dated Oct. 16, 2020, 30 pages.
"Office Action" for Korean Patent Application No. 10-2020-7005082, May 8, 2020, 9 pages, Korean Intellectual Property Office, South Korea (Including English Translation).

"Notice of Reasons for Rejection" for Japanese Patent Application No. 2020-504014, Sep. 2, 2020, 2 pages, Japanese Patent Office, Japan (Including English Translation).
"Notice of Grant" for Korean Patent Application No. 10-2020-7005082, Nov. 24, 2020, 3 pages, The Korean Intellectual Property Office, South Korean (Including English Translation).
"First Office Action" for Chinese Patent Application No. 201880047615.6, Jan. 18, 2021, 8 pages, China National Intellectual Property Administration, Beijing, China (Including English Translation).
"Notice of Allowance" for Japanese Patent Application No. 2020-504014, Feb. 15, 2021, 3 pages, Japanese Patent Office (Including English Translation).
"Extended European Search Report" for European Patent Application No. 18839499.3, Mar. 4, 2021, 10 pages, European Patent Office, Munich, Germany.
"Notice of Preliminary Rejection" for South Korean Patent Application No. 10-2021-7004589, Mar. 10, 2021, 5 pages, Korean Intellectual Property Office, South Korea (Including English Translation).
"Office Action" for Japanese Patent Application No. 2021-056628, Jun. 14, 2021, 2 pages, Japanese Patent Office, Japan (Including English Translation).
"Notice of Grant" for Korean Patent Application No. 10-2021-7004589, 2 pages, Aug. 6, 2021, The Korean Intellectual Property Office, South Korea (Including English Translation).
Second Office Action received for Chinese Patent Application Serial No. 201880047615.6 dated Aug. 25, 2021, 14 pages (Including English Translation).
Decision to Grant a Patent received for Japanese Patent Application Serial No. 2021-056628 dated Nov. 2, 2021, 5 pages (Including English Translation).
Non-Final Office Action received for U.S. Appl. No. 16/168,054 dated Jun. 1, 2021, 102 pages.
"Notification Concerning Transmittal of International Preliminary Report on Patentability (Chapter I of the Patent Cooperation Treaty)" for PCT/US2018/057026, May 28, 2020, 7 pages, The International Bureau of WIPO, Geneva, Switzerland.
Extended European Search Report received for European Patent Application No. 18918938.4, Jul. 6, 2021, 9 pages, European Patent Office, Munich, Germany.
"Notice of Preliminary Rejection" for Korean Patent Application 10-2020-7016928, Jul. 16, 2021, 6 pages, Korean Intellectual Property Office, Daejeon, South Korea (Including English Translation).
Notification Concerning Transmittal of International Preliminary Report on Patentability {Chapter I of the Patent Cooperation Treaty) for International Patent Application No. PCT/US2019/024343, Oct. 15, 2020, 9 pages, The International Bureau of WIPO, Geneva, Switzerland.
"Notice of Preliminary Rejection" for Korean Patent Application No. 10-2020-7029872, Jul. 19, 2021, 10 pages, Korean Intellectual Property Office (Including English Translation).
Extended European Search Report received for European Patent Application Serial No. 19781037.7 dated Oct. 25, 2021, 9 pages.
"Office Action" South Korean Patent Application No. 10-2021-7006391, May 14, 2021, 8 pages, Korean Intellectual Property Office, South Korea (Including English Translation).
International Preliminary Report on Patentability received for PCT Application Serial No. PCT/US2019/043674 dated Feb. 18, 2021, 10 pages.
Notification of Transmittal of the International Search Report and The Written Opinion of the International Searching Authority, or the Declaration for International Patent Application No. PCT/US2020/026964, Jul. 28, 2020, 10 pages, ISA/KR, Korean Intellectual Property Office, Daejeon, Republic of Korea.
International Preliminary Report on Patentability received for PCT Patent Application No. PCT/US2020/026964, mailed in Oct. 21, 2021, 7 pages.
Non-Final Office Action received for U.S. Appl. No. 17/227,300 dated Jun. 30, 2021, 82 pages.
Notification of Transmittal of the International Search Report and the Written Opinion of the International Searching Authority, or the Declaration for Internatonal Patent Application No. PCT/US2020/

(56) References Cited

OTHER PUBLICATIONS

033630, Sep. 9, 2020, 10 pages, International Searching Authority, Korean Intellectual Property Office, Daejeon, Republic of Korea.
Notification of Transmittal of the International Search Report and the Written Opinion of the International Searching Authority, or the Declaration for PCT/US2020/036634, Sep. 21, 2020, 9 pages, ISA/KR, Korean Intellectual Property Office, Daejeong, Republic of Korea.
Office Action received for Chinese Patent Application Serial No. 201780024892.0, mailed on Sep. 2, 2022, 28 pages (11 pages of English Translation and 17 pages of Official Copy).
Extended European Search Report received in European Application No. 20787345.6, mailed on Dec. 5, 2022, 8 pages.
Final Office Action received for U.S. Appl. No. 16/878,140, mailed on Feb. 1, 2023, 26 pages.
Notice of Allowance received for U.S. Appl. No. 17/164,773, mailed on Feb. 1, 2023, 8 pages.
Notice of Allowance received for U.S. Appl. No. 16/841,930, mailed on Jan. 30, 2023, 9 pages.
Office Action for Japanese Patent Application No. 2021-572877, May 12, 2023, 12 pages (8 pages of English Translation and 4 pages of Official Copy).
Partial European Search Report received for European Patent Application No. 22178999.3, mailed on Oct. 10, 2022, 22 pages.
Decision to Grant received for Korean Patent Application Serial No. 10-2022-7021139, mailed on Dec. 14, 2022, 3 pages (1 page of English Translation and 2 pages of Official Copy).
Office Action received for Japanese Patent Application No. 2021-020502, mailed on Jan. 23, 2023, 6 pages (4 pages of English Translation and 2 pages of Official Copy).
Office Action received for Korean Patent Application No. 10-2021-7016081, mailed on Oct. 25, 2022, 4 pages (2 pages of English Translation and 2 pages of Official Copy).
Office Action received for Japanese Patent Application Serial No. 2021-199077, mailed on Dec. 23, 2022, 9 pages (6 pages of English Translation and 3 pages of Official Copy).
Office Action received for Korean Patent Application No. 10-2022-7028820, mailed on Dec. 15, 2022, 12 pages (6 pages of English Translation and 6 pages of Official Copy).
Extended European Search Report received for European Patent Application No. 20815113.4, mailed on Jan. 31, 2023, 14 pages.
Partial European Search Report received for European Patent Application No. 20822328.9, mailed on Feb. 6, 2023, 20 pages.
Office Action received for Korean Patent Application No. 10-2022-7004969, mailed on Jan. 9, 2023, 11 pages (6 pages of English Translation and 5 pages of Official Copy).
Office Action received for Japanese Patent Application Serial No. 2020-552870, mailed on Nov. 29, 2022, 11 pages (7 pages of English Translation and 4 pages of Official Copy).
Office Action received for Japanese Patent Application Serial No. 2022-002790, mailed on Dec. 26, 2022, 10 pages (7 pages of English Translation and 3 pages of Official Copy).
Decision to Grant received for Korean Patent Application Serial No. 10-2020-7029872, mailed on Nov. 28, 2022, 3 pages (1 page of English Translation and 2 pages of Official Copy).
Office Action received for Korean Patent Application No. 10-2022-7015754, mailed on Dec. 12, 2022, 21 pages (11 pages of English Translation and 10 pages of Official Copy).
Non-Final Office Action received for U.S. Appl. No. 17/227,295, mailed on Mar. 9, 2023, 10 pages.
Notice of Allowance received for U.S. Appl. No. 16/366,729, mailed on Mar. 8, 2023, 7 pages.
Extended European Search Report received for European Patent Application No. 22178999.3, mailed on Mar. 6, 2023, 25 pages.
International Search Report and the Written Opinion received for PCT Patent Application No. PCT/US2022/019054, mailed on Feb. 20, 2023, 13 pages.
Office Action received for Korean Application Serial No. 10-2021-7036300, mailed on Feb. 9, 2023, 14 pages (7 pages of English Translation and 7 pages of Official Copy).

Decision to Grant received for Korean Patent Application Serial No. 10-2021-7040665, mailed on Feb. 23, 2023, 3 pages (1 page of English Translation and 2 pages of Official Copy).
Office Action received for Chinese Patent Application Serial No. 201880017776.0, mailed on Feb. 16, 2023, 22 pages (10 pages of English Translation and 12 pages of Official Copy).
Office Action received for Chinese Patent Application Serial No. 201880074279.4, mailed on Mar. 1, 2023, 23 pages (9 pages of English Translation and 14 pages of Official Copy).
Notice of Allowance received for U.S. Appl. No. 16/805,733, mailed on Nov. 10, 2022, 5 pages.
Notice of Allowance received for U.S. Appl. No. 16/841,930, mailed on Oct. 3, 2022, 8 pages.
Non-Final Office Action received for U.S. Appl. No. 16/168,054, mailed on Oct. 20, 2022, 16 pages.
Notice of Allowance received for U.S. Appl. No. 17/164,773, mailed on Nov. 2, 2022, 8 pages.
Notice of Allowance received for U.S. Appl. No. 16/805,733, mailed on Jan. 25, 2023, 5 pages.
International Search Report and the Written Opinion received for PCT Patent Application No. PCT/US2022/028297, mailed on Mar. 13, 2023, 11 pages.
Notice of Allowance received for U.S. Appl. No. 17/164,773, mailed on Apr. 5, 2023, 8 pages.
Office Action received for Japanese Patent Application Serial No. 2021-100687, mailed on Mar. 14, 2023, 05 pages. (3 pages of English Translation and 2 pages of Official Copy).
Office Action received for Japanese Patent Application No. 2020-526502, mailed on Mar. 14, 2023, 8 pages (5 pages of English Translation and 3 pages of Official Copy).
Office Action received for Japanese Patent Application No. 2021-168642, mailed on Mar. 15, 2023, 5 pages (3 pages of English Translation and 2 pages of Official Copy).
Office Action received for Japanese Patent Application No. 2022-80688, mailed on Mar. 17, 2023, 11 pages (7 pages of English Translation and 4 pages of Official Copy).
Non-Final Office Action received for U.S. Appl. No. 17/155,626, mailed on Apr. 12, 2023, 24 pages.
Notice of Allowance received for U.S. Appl. No. 16/841,930, mailed on Apr. 17, 2023, 9 pages.
Final Office Action received for U.S. Appl. No. 16/523,459, mailed on Apr. 14, 2023, 13 pages.
Office Action received for Korean Patent Application No. 10-2022-7036873, mailed on Mar. 29, 2023, 22 pages (12 pages of English Translation and 10 pages of Official Copy).
Extended European Search Report received for European Patent Application No. 20822328.9, mailed on May 4, 2023, 34 pages.
Notice of Allowance received for U.S. Appl. No. 16/805,733, mailed on May 8, 2023, 5 pages.
Office Action received for Korean Patent Application No. 10-2023-7007292, mailed on Apr. 17, 2023, 19 pages (10 pages of English Translation and 9 pages of Official Copy).
Decision to Grant a Patent received for Korean Patent Application Serial No. 10-2023-7009114, mailed on May 16, 2023, 3 pages (1 page of English Translation and 2 pages of Official Copy).
"Written Opinion of the International Searching Authority" for International Patent Application No. PCT/EP2016/077499, Feb. 14, 2017, 7 pages, The International Searching Authority.
"Search Report" for International Patent Application No. PCT/EP2016/077499, 2 pages, International Searching Authority/ EPO, Rijswijk, the Netherlands.
"Notification of Transmittal of the International Search Report and the Written Opinion of the International Searching Authority, or the Declaration" for International Application No. PCT/US2020/038927, 14 pages, ISA/KR, International Searching Authority, Daejeong, Republic of Korean.
"Notification of Transmittal of the International Search Report and the Written Opinion of the International Searching Authority, or the Declaration" for International Patent Application No. PCT/US2021/014564, May 17, 2021, 10 pages, ISA/KR, Korean Intellectual Property Office, Daejeon, Republic of Korea.

(56) References Cited

OTHER PUBLICATIONS

Communication pursuant to Article 94(3) EPC received for EP Patent Application Serial No. 17786325.5 dated Dec. 17, 2021, 5 pages.
Notification of Reason for Refusal received for Korean Patent Application Serial No. 10-2021-7036648 dated Dec. 17, 2021, 8 pages. (Including English Translation).
Decision to Grant a Patent received for Korean Patent Application Serial No. 10-2020-7016928 dated Nov. 16, 2021, 3 pages (Including English Translation).
Final Office Action received for U.S. Appl. No. 16/168,054 dated Jan. 26, 2022, 46 pages.
Notice of Final Rejection received for Korean Patent Application Serial No. 10-2021-7006391 dated Oct. 22, 2021, 5 pages (Including English Translation).
International Preliminary Report on Patentability received for PCT Application Serial No. PCT/US2020/033630 dated Dec. 9, 2021, 8 pages.
International Preliminary Report on Patentability received for PCT Application Serial No. PCT/US2020/036634 dated Dec. 23, 2021, 6 pages.
International Search Report and Written Opinion received for PCT Application Serial No. PCT/US2021/058687 dated Mar. 3, 2022, 11 pages.
Notice of Preliminary Rejection received for Korean Patent Application Serial No. 10-2018-7030512 dated Dec. 23, 2021, 6 pages. (Including English Translation).
Decision to Grant a Patent received for Japanese Patent Application Serial No. 2021-14376 dated Mar. 22, 2022, 05 pages (Including English Translation).
Non-Final Office Action received for U.S. Appl. No. 17/164,773 dated Apr. 21, 2022, 87 pages.
Decision to Grant a Patent received for Chinese Patent Application Serial No. 201880047615.6 dated Mar. 23, 2022, 3 pages (Including English Translation).
Decision to Grant a Patent received for Korean Patent Application Serial No. 10-2018-7030512 dated Mar. 18, 2022, 4 pages (Including English Translation).
Decision to Grant a Patent received for Korean Patent Application Serial No. 10-2021-7036648 dated May 19, 2022, 4 pages (Including English Translation).
Decision to Grant a Patent received for Japanese Patent Application Serial No. 2019-549550 dated Feb. 25, 2022, 5 pages (Including English Translation).
"Office Action" for Japanese Patent Application No. 2021-0020502, Apr. 13, 2022, 10 pages, Japanese Patent Office, Japan (Including English Translation).
Notice of Allowance received for U.S. Appl. No. 17/227,300 dated Aug. 2, 2022, 39 pages.
International Search Report and Written Opinion received for PCT Application Serial No. PCT/US2021/020749 dated Jan. 3, 2022, 9 pages.
International Preliminary Report on Patentability received for PCT Application Serial No. PCT/US2020/038927 dated Jan. 6, 2022, 9 pages.
Notification of Reason for Refusal received for Korean Application Serial No. 10-2020-7029872 dated Jan. 19, 2022, 30 pages (Including English Translation).
Extended European Search Report received for European Patent Application Serial No. 19843301.3 dated Feb. 18, 2022, 10 pages.
International Preliminary Report on Patentability received for PCT Application Serial No. PCT/US2020/043979 dated Feb. 1, 2022, 05 pages.
Notice of Final Rejection received for Korean Application Serial No. 10-2020-7029872 dated May 24, 2022, 05 pages (Including English Translation).
Decision to Grant a Patent received for Korean Patent Application Serial No. 10-2021-7006391 dated Feb. 9, 2022, 04 pages (Including English Translation).
Restriction Requirement received for U.S. Appl. No. 16/366,729 dated Jun. 3, 2022, 06 pages.
"Notification of Transmittal of the International Search Report and the Written Opinion of the International Searching Authority, or the Declaration" for International Patent Application No. PCT/US2020/043979, Nov. 10, 2020, 9 pages, ISA/KR, Korean Intellectual Property Office, Daejeon, Republic of Korea.
Office Action received for Japanese Patent Application No. 2021-559434, mailed on May 26, 2023, 17 pages (11 pages of English Translation and 6 pages of Official Copy).
International Preliminary Report on Patentability received for PCT Application Serial No. PCT/US2021/058687, mailed on May 25, 2023, 7 pages.
Extended European Search Report received for European Patent Application No. 20831915.2, Jun. 2, 2023, 9 pages.
Notice of Allowance received for Chinese Patent Application Serial No. 201780024892.0, mailed on May 30, 2023, 2 pages (Official Copy Only).
Plant, et al., 256-Channel Bidirectional Optical Interconnect Using VCSELs and Photodiodes on CMOS, IEEE Journal of Lightwave Technology, Aug. 2001, pp. 1093-1103, vol. 19, No. 8.
Knodl, et al., Bipolar Cascade VCSEL with 130% Differential Quantum Efficiency, Annual Report 2000, Optoelectronics Department, University of ULM, pp. 11-14.
R.A. Morgan, et al., Two-Dimensional Matrix Addressed Vertical Cavity Top-Surface Emitting Laser Array Display, IEEE Photonics Technology Letters, Aug. 1994, pp. 913-917, vol. 6, No. 8.
M. Orenstein, et al., Matrix Addressable Vertical Cavity Surface Emitting Laser Array, Electronics Letters, Feb. 28, 1991, pp. 437-438, vol. 27, No. 5.
K.M. Geib, et al., Fabrication and Performance of Two-Dimensional Matrix Addressable Arrays of Integrated Vertical-Cavity Lasers and Resonant Cavity Photodetectors, IEEE Journal of Selected Topics in Quantum Electronics, Jul./Aug. 2002, pp. 943-947, vol. 8, No. 4.
Moench, et al., VCSEL Based Sensors for Distance and Velocity, Vertical Cavity Surface-Emitting Lasers XX, Edited by K. Choquette, J. Guenter, Proc of SPIE, 2016, 11 pages, vol. 9766, 07660A.
Office Action received for Japanese Patent Application Serial No. 2021-100687, mailed on Jul. 1, 2022, 09 pages. (6 pages of English Translation and 3 pages of Official Copy).
Restriction Requirement received for U.S. Appl. No. 16/523,459, mailed on Jun. 16, 2022, 05 pages.
Notice of Allowance received for U.S. Appl. No. 16/841,930, mailed on Jun. 29, 2022, 10 pages.
Non-Final Office Action received for U.S. Appl. No. 16/878,140, mailed on Jun. 22, 2022, 24 pages.
Non-Final Office Action received for U.S. Appl. No. 16/907,732, mailed on Jul. 13, 2022, 20 pages.
International Preliminary Report on Patentability received for PCT Application Serial No. PCT/US2021/014564, mailed on Aug. 4, 2022, 06 pages.
Notice of Allowance received for U.S. Appl. No. 16/895,588, mailed on Aug. 3, 2022, 9 pages.
Non-Final Office Action received for U.S. Appl. No. 16/366,729, mailed on Aug. 26, 2022, 09 pages.
Non-Final Office Action received for U.S. Appl. No. 16/523,459, mailed on Sep. 13, 2022, 11 pages.
Office Action received for Japanese Patent Application Serial No. 2021-168642, mailed on Aug. 25, 2022, 4 pages (2 pages of English Trasnlation and 2 pages of Official Copy).
Office Action received for Japanese Patent Application Serial No. 2020-526502, mailed on Aug. 24, 2022, 10 pages (5 pages of English Translation and 5 pages of Official Copy).
Notice of Allowance received for U.S. Appl. No. 16/805,733, mailed on Aug. 22, 2022, 13 pages.
International Preliminary Report on Patentability received for PCT Application Serial No. PCT/US2021/020749, mailed on Sep. 15, 2022, 8 pages.
U.S. Appl. No. 16/841,930, filed Apr. 7, 2020, USPTO.
U.S. Appl. No. 16/878,140, filed May 19, 2020, USPTO.
U.S. Appl. No. 16/895,588, filed Jun. 8, 2020, USPTO.
U.S. Appl. No. 16/907,732, filed Jun. 22, 2020, USPTO.

(56) References Cited

OTHER PUBLICATIONS

Extended European Search Report received for European Patent Application No. 20846794.4, mailed on Jul. 17, 2023, 6 pages.
Office Action received for Japanese Patent Application Serial No. 2022-505574, mailed on Aug. 28, 2023, 10 pages (6 pages of English Translation and 4 pages of Official Copy).
Office Action received for Chinese Patent Application No. 202080054714.4, mailed on Aug. 29, 2024, 13 pages including 6 pages of English Translation.

* cited by examiner

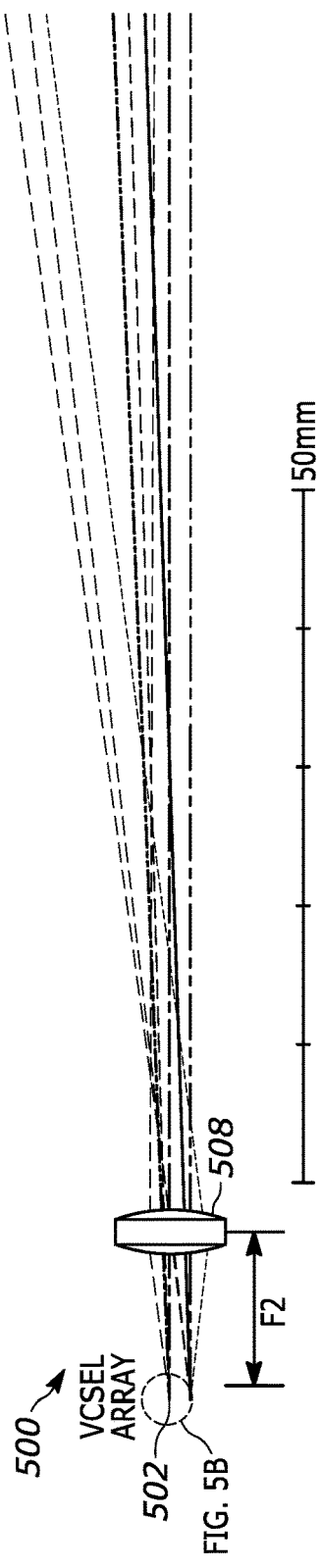
FIG. 5A
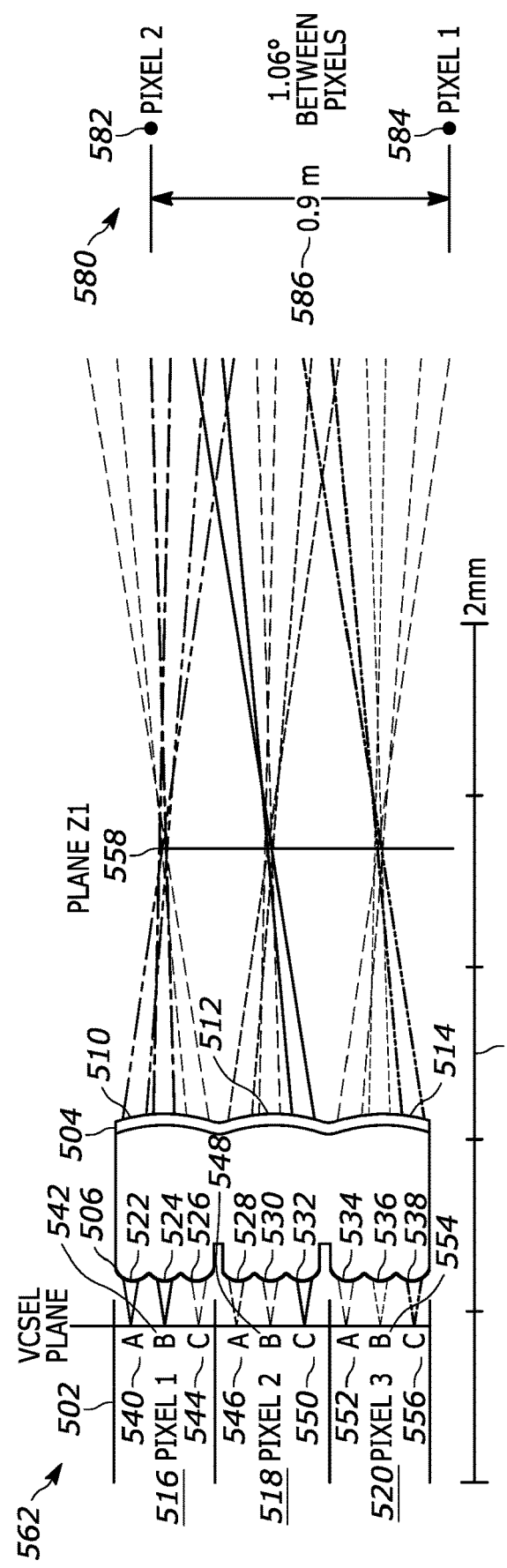
FIG. 5B
FIG. 5C

HIGH-RESOLUTION SOLID-STATE LIDAR TRANSMITTER

The section headings used herein are for organizational purposes only and should not to be construed as limiting the subject matter described in the present application in any way.

CROSS REFERENCE TO RELATED APPLICATION

The present application is a non-provisional application of U.S. Provisional Patent Application No. 62/881,354 filed on Jul. 31, 2019, entitled "High-Resolution Solid-State LIDAR Transmitter". The entire contents of U.S. Provisional Patent Application No. 62/881,354 are herein incorporated by reference.

INTRODUCTION

Autonomous, self-driving, and semi-autonomous automobiles use a combination of different sensors and technologies, such as radar, image-recognition cameras, and sonar for detection and location of surrounding objects. These sensors enable a host of improvements in driver safety including collision warning, automatic-emergency braking, lane-departure warning, lane-keeping assistance, adaptive cruise control, and piloted driving. Among these sensor technologies, light detection and ranging (LIDAR) systems take a critical role, enabling real-time, high-resolution 3D mapping of the surrounding environment.

The majority of commercially available LIDAR systems used for autonomous vehicles today utilize a small number of lasers, combined with some method of mechanically scanning the environment. It is highly desired that future autonomous automobiles utilize solid-state semiconductor-based LIDAR systems that support fast scanning rates and ease of integration with high reliability and wide environmental operating ranges.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

FIG. 5A illustrates an embodiment of a transmit optical system for projecting optical beams from a laser array that uses two microlens arrays and a bulk lens of the present teaching.

FIG. 5B illustrates an expanded view of a portion of the transmit optical system shown in FIG. 5A.

FIG. 5C illustrates an embodiment of a far field pattern generated by the transmit optical system for projecting optical beams from the laser array shown in FIG. 5A.

DESCRIPTION OF VARIOUS EMBODIMENTS

Figure 1:
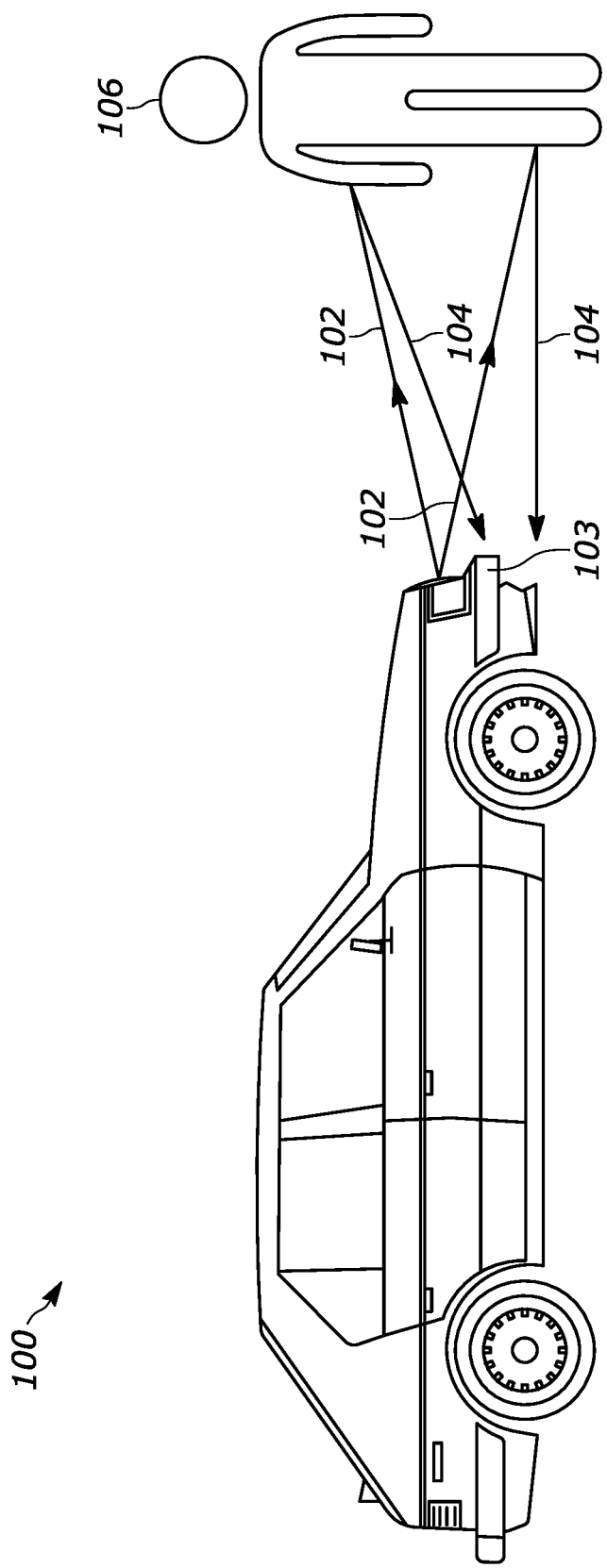
FIG. 1 is a schematic diagram illustrating the operation of an embodiment of a high-resolution LIDAR system of the present teaching implemented in a vehicle.

The present teaching will now be described in more detail with reference to exemplary embodiments thereof as shown in the accompanying drawings. While the present teaching is described in conjunction with various embodiments and examples, it is not intended that the present teaching be limited to such embodiments. On the contrary, the present teaching encompasses various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the method of the present teaching can be performed in any order and/or simultaneously as long as the teaching remains operable. Furthermore, it should be understood that the apparatus and method of the present teaching can include any number or all of the described embodiments as long as the teaching remains operable.

The present teaching relates to Light Detection and Ranging (LIDAR), which is a remote sensing method that uses laser light to measure distances (ranges) to objects. LIDAR systems measure distances to various objects or targets that reflect and/or scatter light. Autonomous vehicles make use of LIDAR systems to generate a highly accurate three-dimensional (3D) map of the surrounding environment with fine resolution. The systems and methods described herein are directed towards providing a solid-state, pulsed time-of-flight (TOF) LIDAR system with high levels of reliability, while also maintaining long measurement range and providing relatively low cost. In particular, LIDAR systems according to the present teaching send out a short time duration laser pulse, and use direct detection of the return pulse in the form of a received return signal trace to measure TOF to the object.

In addition, LIDAR systems of the present teaching are capable of using multiple laser pulses to detect objects with various performance metrics. For example, multiple laser pulses can be used to improve SNR. Multiple laser pulses can also be used to provide greater confidence in the detection of a particular object. For example, particular numbers of laser pulses can be selected to give particular levels of SNR and/or particular confidence values associated with detection of an object. This selection of a number of laser pulses can be combined with selection of an individual or group of laser devices that are associated with a particular pattern of illumination in the FOV.

One feature of the LIDAR systems of present teaching is that the emitters can emit light at different wavelengths. Thus, various emitters in the array can produce light with different wavelengths than other emitters. For example, emitters in a column or in a row may emit one wavelength, and emitters in an alternating column or row may emit a different wavelength. A variety of wavelength patterns of emitted laser light with different wavelengths can be used, for example, to provide desired resolution, operate at long ranges within eye-safe limits of operation, and/or to increase the data rate of the system. See, for example, U.S. Patent Publication No. 20170307736 A1, entitled "Multi-Wavelength LIDAR System" and U.S. Patent Publication No. 20180259623 A1, entitled "Eye-Safe Scanning LIDAR System", which are both assigned to the present assignee. U.S. Patent Publication Nos. 20170307736 A1 and 20180259623 A1 are incorporated herein by reference.

FIG. 1 is a schematic diagram illustrating the operation of a LIDAR system 100 of the present teaching implemented in a vehicle. The LIDAR system 100 includes a transmit optical system, which is described in more detail herein, that projects light beams 102 generated by a laser array in the transmit optical system toward a target scene. The LIDAR system also includes a receiver 103 that receives the light 104 that reflects from an object, shown as a person 106, in that target scene. LIDAR systems typically also include a controller that computes the distance information about the object, person 106, from the reflected light.

In some embodiments, there is also an element that can scan or provide a particular pattern of the light that may be a static pattern or a dynamic pattern across a desired range and field-of-view (FOV). A portion of the reflected light from the object, person 106, is received by the receiver 103. In some embodiments, the receiver comprises receive optics and a detector element that may be an array of detectors. The receiver and controller are used to convert the received signal light into measurements that represent a pointwise 3D map of the surrounding environment that falls within the LIDAR system range and FOV.

Some embodiments of LIDAR systems according to the present teaching use a laser transmitter that includes a laser array. In some embodiments, the laser array comprises VCSEL laser emitters, which may include top-emitting VCSELs, bottom-emitting VCSELs, and/or various types of high-power VCSELs. The VCSEL arrays may be monolithic. The laser emitters may all share a common substrate, including semiconductor substrates or ceramic substrates. A single controlled laser emitter can include multiple sub-apertures that each emit an optical beam when the laser emitter is energized.

In some embodiments, the energizing of individual lasers and/or groups of lasers in embodiments that use one or more transmitter arrays can be individually controlled. Each individual emitter in the transmitter array can be fired independently, with the optical beam emitted by each laser emitter corresponding to a three-dimensional projection angle subtending only a portion of the total system field-of-view. One example of such a LIDAR system is described in U.S. Patent Publication No. 2017/0307736 A1, which is assigned to the present assignee. In addition, the number of pulses fired by an individual laser, or group of lasers can be controlled based on a desired performance objective of the LIDAR system. The duration and timing of this sequence can also be controlled. See, for example, U.S. Provisional Patent Application No. 62/714,463, entitled "Distributed Modular Solid-State LIDAR System", which is assigned to the present assignee and incorporated herein by reference. See also, U.S. Provisional Patent Application No. 62/859,349, entitled "Eye-Safe Long-Range Solid-State LIDAR System", and U.S. Provisional Patent Application No. 62/866,119, entitled "Adaptive Multiple-Pulse LIDAR System", which are also both assigned to the present assignee and incorporated herein by reference.

Another feature of the LIDAR system of the present teaching is that it can provide a compact, reliable transmit optical assembly for a high-resolution LIDAR system. Transmit optical assemblies of the present teaching utilize solid-state laser arrays that, in some embodiments, are fabricated on the same substrate. The substrate can be a semiconductor substrate. Electrical drive circuits are also fabricated on these array substrates that allow each laser in the array to be controlled individually. These arrays can be two-dimensional arrays that use a regular row and column configuration. The electrical control drive scheme can be configured in a so-called matrix configuration, where an individual laser is addressed by appropriate application of an electrical control signal to a particular column and a particular row that contains that individual laser. See, for example, U.S. patent application Ser. No. 16/841,930, entitled "Solid-State LIDAR Transmitter with Laser Control", which is assigned to the present assignee and is incorporated herein by reference.

Figure 2A:
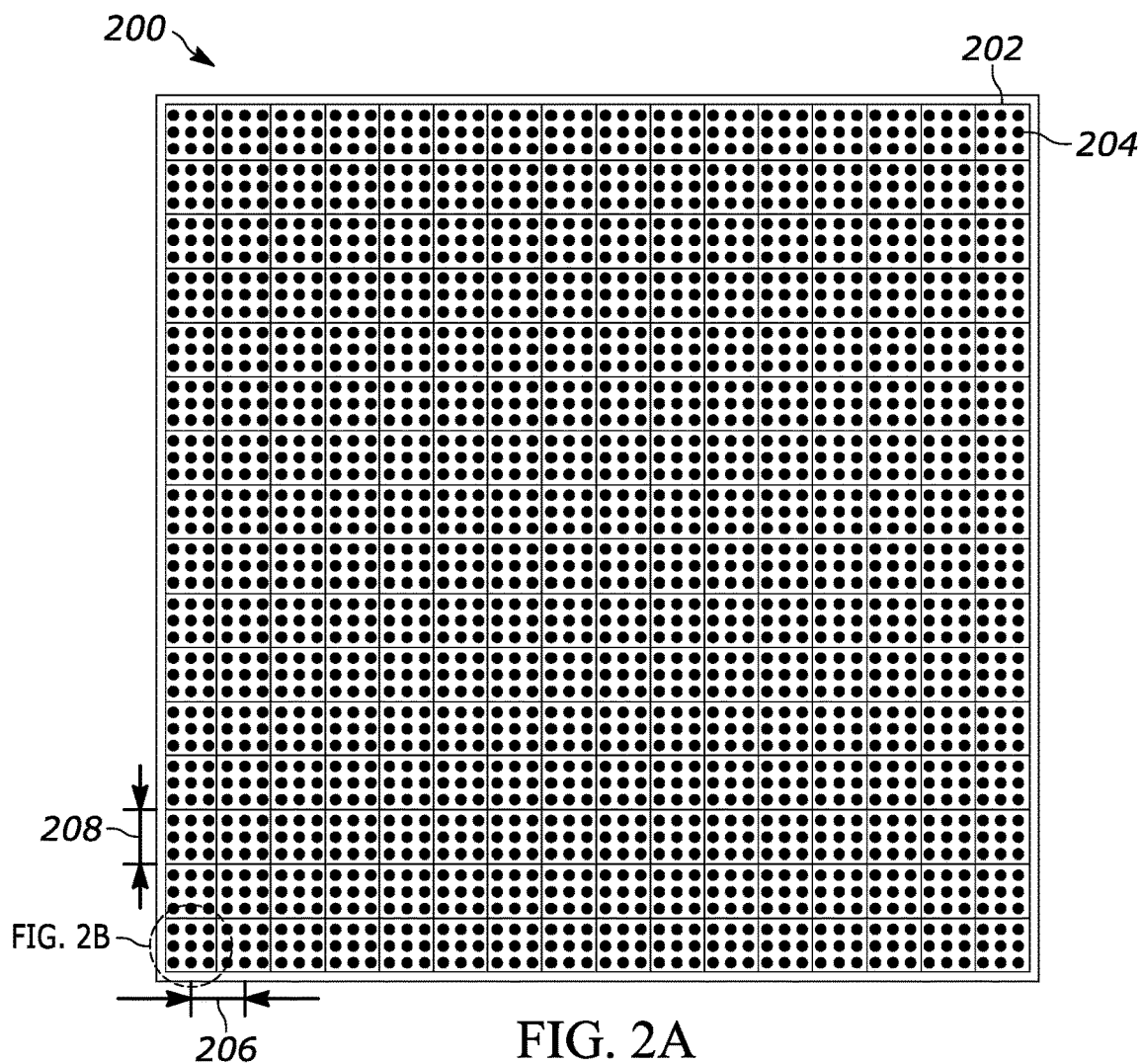
FIG. 2A illustrates a two-dimensional vertical cavity surface emitting laser (VCSEL) array that can be used in a high-resolution LIDAR system of the present teaching.

FIG. 2A illustrates a two-dimensional vertical cavity surface emitting laser (VCSEL) array 200 that can be used in a high-resolution LIDAR system of the present teaching. The laser array 200 includes a 16×16 array of individual laser pixels 202, where each pixel 202 incorporates a 3×3 array of sub-apertures 204. In some embodiments, each pixel 202 is addressable individually by applying the correct electrical control signal to a row and column corresponding to that pixel 202 in the array. Thus, individual pixels 202 are energized independently, and all sub-apertures 204 within one pixel 202 are energized together with the energization of the pixel 202. Thus, nine optical beams are provided for each pixel that is energized.

The array 200 has a pixel pitch 206 in the x-direction and a pixel pitch 208 in the y-direction. In some embodiments, the x-directed pixel pitch 206 is equal to the y-directed pixel pitch 208. For example, in one particular embodiment, the x-directed pixel pitch is 250 μm and the y-directed pixel pitch is 250 μm. The number of elements in the array 200 varies in various embodiments. The array pixel pitch may take on various values in various embodiments. It should be understood that while many examples provided herein describe arrays of particular sizes, the present teaching is not limited to any particular array size. One feature of the present teaching is that the solid state, microfabricated components can scale to large sizes simply, cost effectively and have high reliability.

Figure 2B:
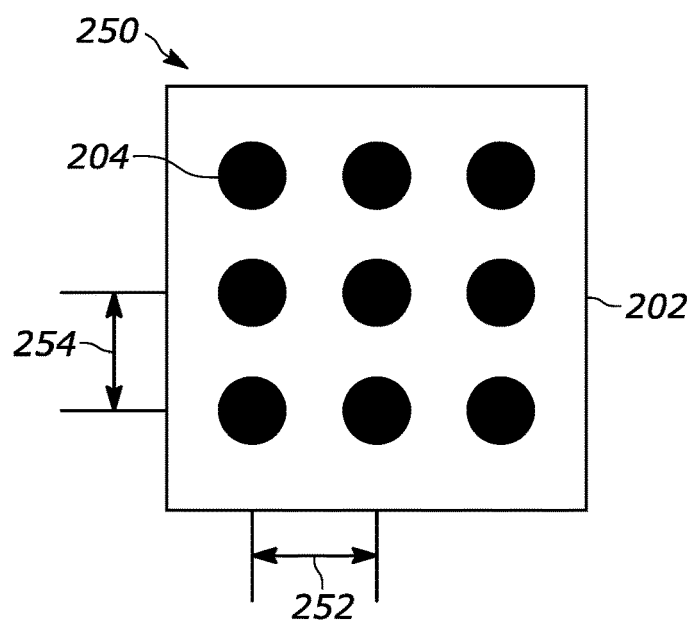
FIG. 2B illustrates an array of sub-apertures of the two-dimensional VCSEL array of FIG. 2A.

FIG. 2B illustrates an array 250 of sub-apertures of the two-dimensional VCSEL array 200 of FIG. 2A. A single pixel 202 is shown. Each pixel 202 has nine sub-apertures 204 configured in a 3×3 array. Each pixel 202 has an x-directed sub-aperture pitch 252 and a y-directed sub-aperture pitch 254. The sub-apertures 204 associated with an individual pixel 202 are all energized at the same time in response to an appropriate electrical control signal. As such, all sub-apertures 204 within an individual pixel 202 illuminate at the same time. Thus, multiple optical beams are generated, one from each aperture in the pixel, upon application of the electrical control signal to a pixel 202. In some embodiments, the x-directed sub-aperture pitch 252 is equal to the y-directed sub-aperture pitch 254. For example, in one specific embodiment, the x-directed sub-aperture pitch is 76 μm and the y-directed sub-aperture pitch is 76 μm. The number of apertures in the sub-array of an individual pixel varies in various embodiments. The array sub-aperture pitch may take on various values in various embodiments.

Figure 3A:
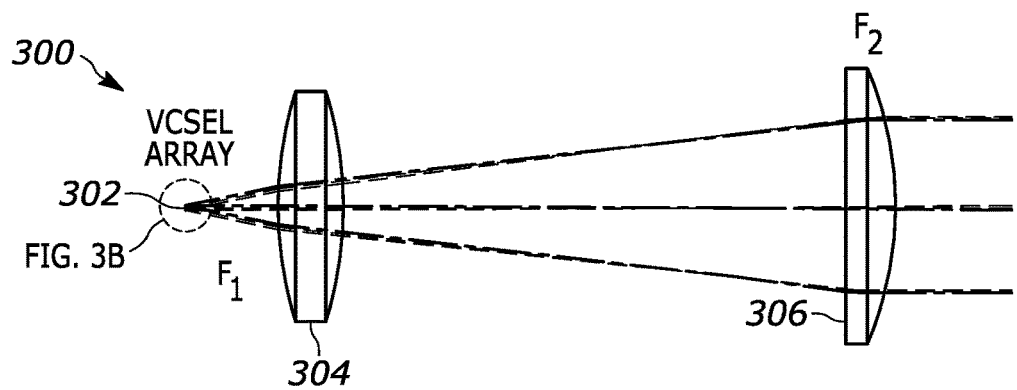
FIG. 3A illustrates a transmit optical system for projecting optical beams from a laser array that uses two conventional bulk lenses.

FIG. 3A illustrates a transmit optical system 300 for projecting optical beams from a laser array 302 that uses two conventional bulk lenses 304, 306. The laser array 302 may be the same or similar to the laser array 200 described in connection with FIGS. 2A-B, for example.

Figure 3B:
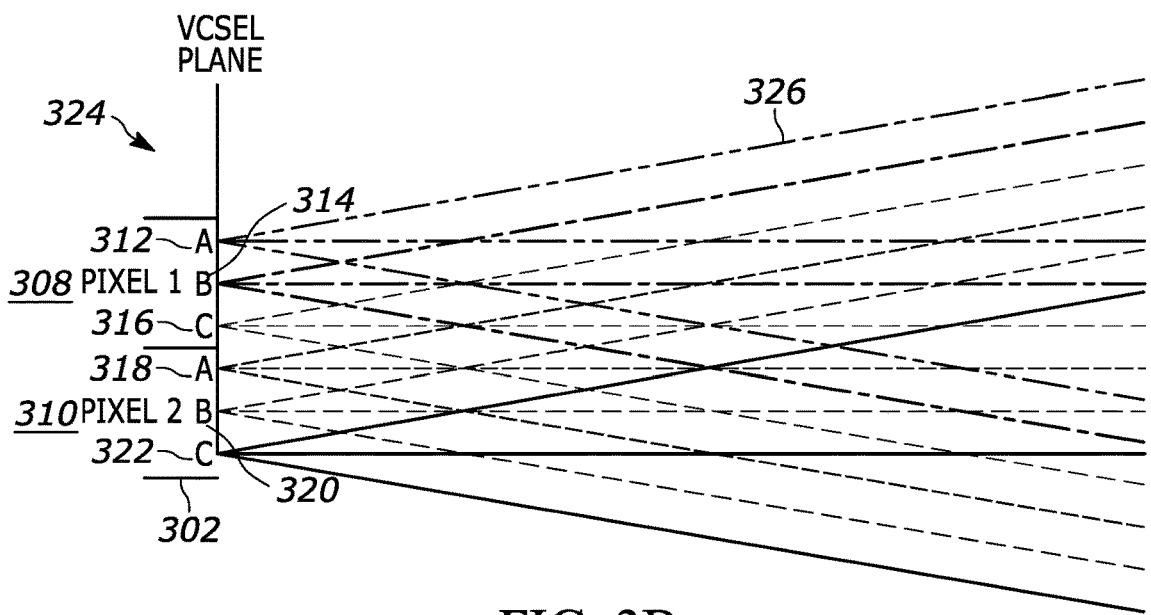
FIG. 3B illustrates an expanded view of a portion of the transmit optical system shown in FIG. 3A.

FIG. 3B is an expanded view of a portion of the transmit optical system 300 shown in FIG. 3A. The laser array 302 is shown in one dimension and includes individual pixels 308, 310. Only two pixels are shown, pixel 1 308 and pixel 2 310. The pixels 308, 310 each have sub-aperture arrays. Also, show in one dimension are sub-apertures A 312, B 314 and C 316 of pixel 1 308 and sub-apertures A 318, B 320 and C 322 of pixel 2 310. Optical beams 326 from each sub-aperture 312, 314, 316, 318, 320, 322 are emitted and diverge as shown in the expanded view 324. The divergence angle for each beam is related to the size of the respective sub-aperture.

Referring to both FIGS. 3A and 3B, the individual diverging optical beams 326 pass through a bulk lens 304 with a focal length, F1, which is positioned at a distance from the array 302 and a second bulk lens 306 with a focal length, F2, which is positioned at a distance from the first bulk lens 304. The positions of the lenses 304, 306 and their focal lengths F1, F2 determine a projected far field pattern of the transmit optical system 300. For this optical system, the two bulk lenses 304, 306 are configured to nominally generate an image of the laser array 302 in the far field. Thus, the laser array pattern is recreated in the far field, magnified to a desired size based on the lens configuration, and the sub-apertures from individual pixels are separated in space. The angular field-of-view (FOV) of each pixel is approximately the same as the angle spacing between pixels.

Figure 3C:
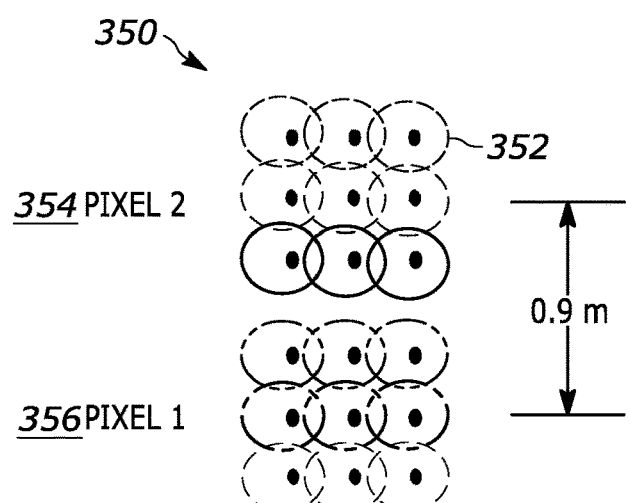
FIG. 3C illustrates a far field pattern generated by the transmit optical system for projecting optical beams from the laser array of FIG. 3A.

FIG. 3C illustrates a far field pattern 350 generated by the transmit optical system 300 for projecting optical beams from the laser array of FIG. 3A. The far field spots are shown for two vertically adjacent pixels, where each pixel comprises a 3×3 array of sub-apertures at 50-meter range. This example far field pattern 350 is produced at a 50-meter distance from the optical system 300. The pattern 350 includes nine individual spots 352 for each pixel region 354, 356. The individual pixel regions 354, 356 are spaced a distance of 0.9 meters at the 50-meter range. The pixel-spot-size-to-pixel-pitch ratio is ~0.9.

FIGS. 3A-C illustrate only a portion of, for example, a 16×16 array of lasers that each have nine sub-apertures. For a full 16×16 array, the pattern will appear as (16×3)×(16×3) spots, or 48×48 spots.

Figure 4A:
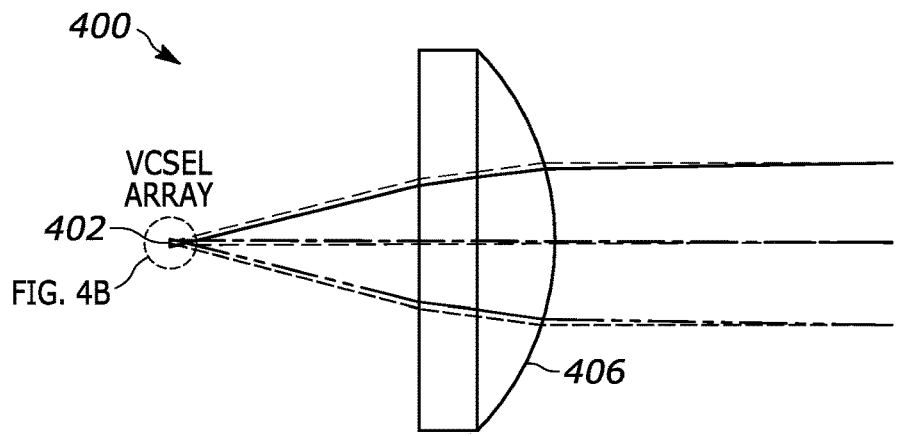
FIG. 4A illustrates a transmit optical system for projecting optical beams from a laser array that uses one microlens array and one bulk lens.

It is possible to reduce the spot sizes from the emitters in the far field by using a small lens placed close to the laser emitter to nominally collimate and/or focus each of the optical beams. FIG. 4A illustrates a transmit optical system 400 for projecting optical beams from a laser array 402 that uses one microlens array 404 and one bulk lens 406.

Figure 4B:
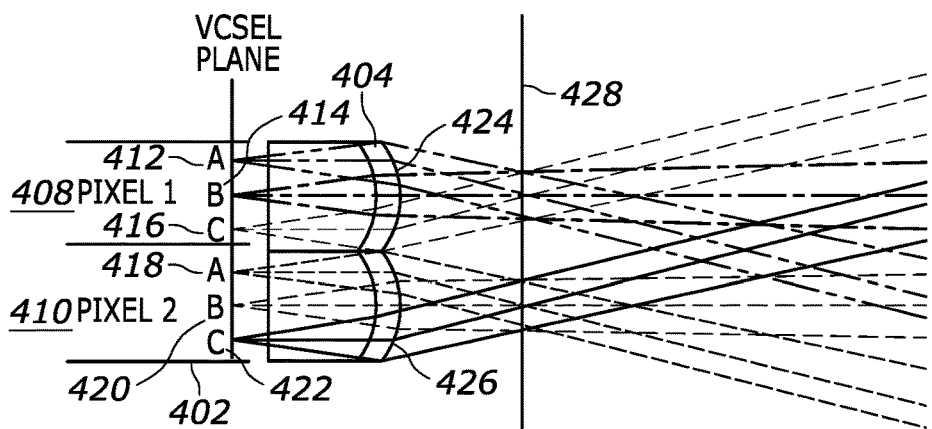
FIG. 4B illustrates an expanded view of a portion of the transmit optical system shown in FIG. 4A.

FIG. 4B is an expanded view of a portion of the transmit optical system 400 shown in FIG. 4A. Referring to both FIGS. 4A and 4B, in this transmit optical system 400, the microlens array 404 has a pitch equal to the pitch of the pixels, pixel 1 408 and pixel 2 410, in the array 402. The microlens array 404 collimates each sub-aperture, sub-apertures A 412, B 414, and C 416, of pixel 1 408, and sub-apertures A 418, B 420, and C 422 of pixel 2 410. The microlens array 404 comprises multiple lenslets 424, 426 that are spaced at a pitch that is the same as the pixel pitch of the laser array 402.

Each lenslet 424, 426 collimates a beam emitted from a respective pixel 408, 410. The collimated beams from each sub-aperture 412, 414, 416, 418, 420, 422 overlap at a plane Z1 428 that is located one focal distance away from the lenslets 424, 426 in the microlens array 404. The bulk lens 406 has a focal length, F2, and is positioned a distance of F2 from the plane Z1 428. The bulk lens 406 projects the optical beams from each pixel along nominally parallel paths to the far field.

Figure 4C:
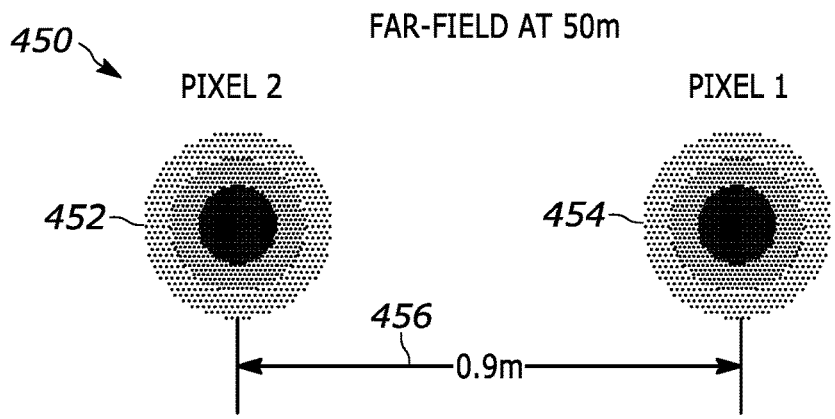
FIG. 4C illustrates a far field pattern generated by the transmit optical system for projecting optical beams from the laser array of FIG. 4A.

FIG. 4C illustrates a far field pattern 450 generated by the transmit optical system 400 for projecting optical beams from the laser array 402 of FIG. 4A. The far field spots are shown for two vertically adjacent pixels, where each pixel comprises a 3×3 array of sub-apertures at 50-meter range. The far field pattern 450 results in two large spots 452, 454 that are separated by a 0.9-meter distance 456 at a range of 50 meters. In large spot 454, the optical beams from all nine sub-apertures from a single pixel 408 overlap. The pixel-spot-size-to-pixel-pitch ratio is ~0.5.

Note that FIG. 4A only illustrates three sub-apertures 412, 414, 416 for pixel 1 408 because it is a side view, but the far-field pattern 450 is illustrated in two dimensions and so shows a spot provided by all nine sub-apertures of pixel 1 408. Likewise, for pixel 2 410 and associated spot 452. The pixel-spot-size-to-pixel-pitch ratio for this transmit optical system is ~0.5.

A LIDAR system that uses the transmit optical system 400 illustrated in FIGS. 4A-C has improved the resolution because it has reduced the spot size as compared to systems that do not use microlenses for collimation. However, a feature of the present teaching is the realization that the use of two patterned back-to-back microlens arrays can provide further improvement to the LIDAR system resolution.

FIG. 5A illustrates an embodiment of a transmit optical system 500 for projecting optical beams from a laser array 502 that uses two microlens arrays 504, 506 and a bulk lens 508 of the present teaching.

FIG. 5B is an expanded view of a portion of the transmit optical system 500 shown in FIG. 5A. Referring to both FIGS. 5A and 5B, one microlens array 504 has lenslets 510, 512, 514 spaced at a pitch equal to the pitch of the pixels, pixel 1 516 and pixel 2 518, and pixel 3 520 in the laser array 502. Another microlens array 506 has lenslets 522, 524, 526, 528, 530, 532, 534, 536, 538 spaced at a pitch equal to the pitch of sub-apertures 540, 542, 544, 546, 548, 550, 552, 554, 556 of the laser array 502. Thus, microlens 506 comprises one lenslet per sub-aperture, and microlens 504 comprises one lenslet per pixel. Microlens array 506 acts on each of the optical beams generated in each sub-aperture 540, 542, 544, 546, 548, 550, 552, 554, 556 such that each sub-aperture beam is focused without changing the propagation axis of those optical beams. Microlens 504 redirects the optical beams from each sub-aperture 540, 542, 544, 546, 548, 550, 552, 554, 556 so that they overlap at the back focal plane Z1 558 of the lenslets 510, 512, 514. Thus, the optical beams from each sub-aperture 540, 542, 544, 546, 548, 550, 552, 554, 556 are focused at the overlap plane at back focal plane Z1 558 by the combined action of microlens array 506 and microlens array 504. The bulk lens 508 is positioned a distance equal to a focal length of the lens 508, F2, from the plane Z1 558. The combination of the microlens arrays 504, 506 creates an intermediate real image of an array of spots with the same pitch as the laser array 502 at a plane Z1 558. The bulk lens 508 projects each of the spots from Z1 558 to a different angle in the far field. The particular projected angle from the bulk lens 508 is a function of the perpendicular distance of the corresponding array spot from the principal optical axis of the system.

One feature of the present teaching is the use of two back-to-back micro lens arrays 504, 506 that serve to focus optical beams from each sub-aperture and direct those beams to overlap at a back focal plane of the second lens 504. As is clear from the scale 560 in the expanded view 562, these two microlens array 504, 506 designs are very compact, and nominally focused overlapped beams occur at a distance of less than 2 mm from the laser array 502. In some embodiments, the microlens arrays 504, 506 are fabricated on a front and back surface of the same substrate. This advantageously provides a very compact system that is easy to assemble. In some embodiments, the microlens arrays 504, 506 are fabricated on separate substrates. In some embodiments, one or both of the microlens arrays 504, 506 may be refractive optical elements. In some embodiments, one or both of the microlens arrays 504, 506 may be diffractive optical elements. In some embodiments, one or both of the microlens arrays 504, 506 may be holographic optical elements.

FIG. 5C illustrates an embodiment of a far field pattern 580 generated by the transmit optical system 500 for projecting optical beams from a laser array 502 of FIG. 5A. The far field spots are shown for two vertically adjacent pixels, where each pixel comprises a 3×3 array of sub-apertures at 50-meter range. Note that the system diagram of FIG. 5A shows a side view of the 2-dimensional arrays, but FIG. 5C illustrates a two-dimensional pattern in a plane perpendicular to the principle axis. Only portions of the system are illustrated for clarity. The far field pattern 580 results in two small spots 582, 584 that are separated by a 0.9-meter distance 586 at a range of 50 meters. Spots 582, 584 are only shown for two pixels 516, 518. There is 1.06 degrees between pixels, resulting in 0.9-meter separation distance 586 at the 50-meter range. The pixel-spot-size-to-pixel-pitch ratio is ~0.1. The ultimate resolution is determined by the spot size from one pixel relative to the spot separation between spots from adjacent pixels. Thus, the transmit optical system of the present teaching advantageously provides a much smaller pixel spot size-to-pixel-pitch ratio in the far field. This improves system resolution and also allows for effective and scalable interleaving of multiple transmit optical systems that provides many benefits for data collection, including the support of high data collection rates and flexibility in illumination patterns and timing sequences.

Figure 6:
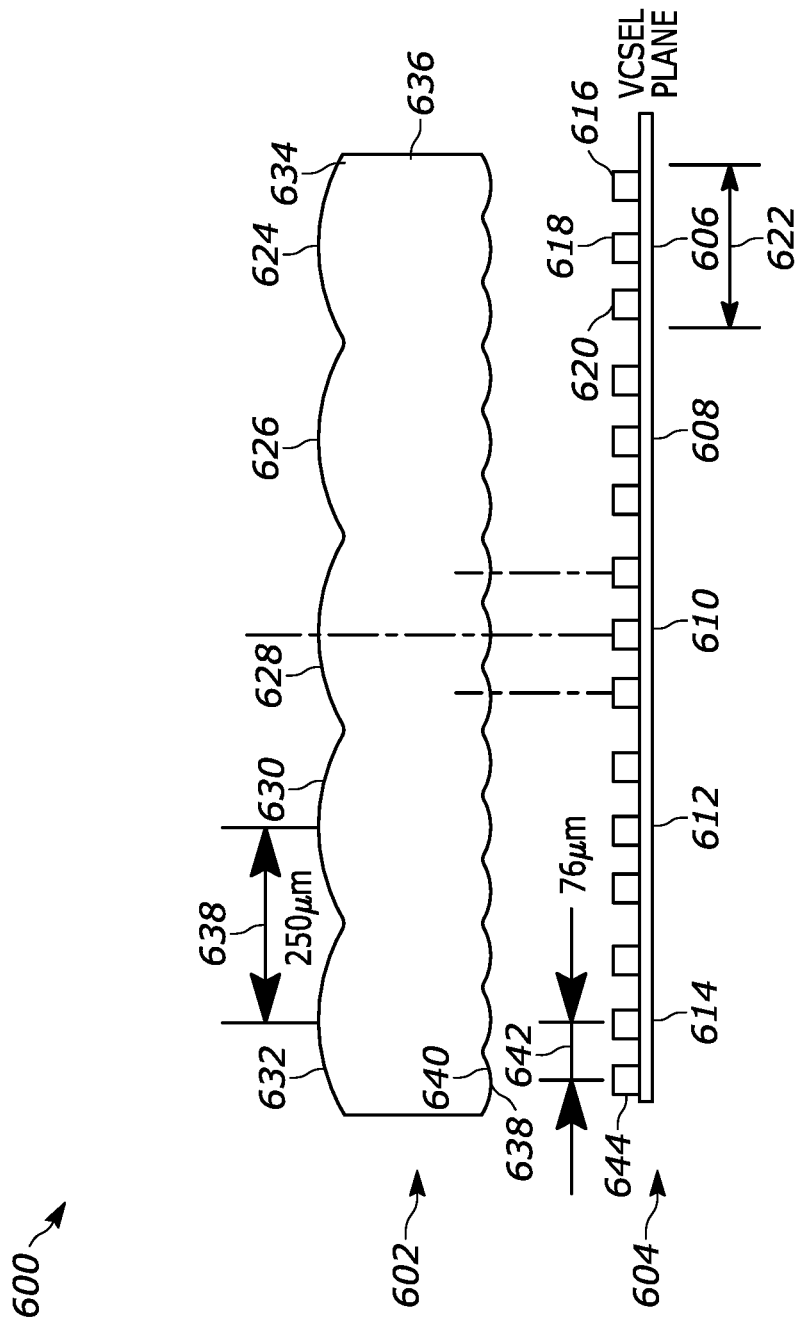
FIG. 6 illustrates a cross-sectional view of an embodiment of a dual-sided microlens array aligned to a VCSEL array of the present teaching.

FIG. 6 illustrates a cross-sectional view 600 of an embodiment of a dual-sided microlens array 602 aligned to a VCSEL array 604 of the present teaching. The VCSEL includes five pixels 606, 608, 610, 612, 614. Each pixel 606, 608, 610, 612, 614 comprises nine sub-apertures. For example, three sub-apertures 616, 618, 620 are visible in the cross-sectional view 600 for pixel. The pixels are arranged in an array with pitch 622. Five-pixel lenslets 624, 626, 628, 630, 632 are formed on a first surface 634 of a substrate 636. The pixel lenslets 624, 626, 628, 630, 632 are arranged in an array with pitch 638 and match the array of pixels 606, 608, 610, 612, 614 in the VCSEL array 604. Formed on a second surface 638 of substrate 636 are sub-aperture lenslets 640 that are set on pitch 642 which matches the pitch of the sub-apertures of the VCSEL array 604. This microlens array 602 configuration can be referred to as a dual-sided microlens. In one particular embodiment, the pixel pitch is 250 µm and the sub-aperture pitch is 76 µm. In some embodiments, the laser and microlens arrays 602, 604 are one-dimensional. Also, in some embodiments, the microlens arrays 602, 604 are two-dimensional. In various embodiments, the microlens arrays 602, 604 contain different numbers of pixels, sub-apertures, pixel lenslets and/or sub-aperture lenslets. In some embodiments, the pixel pitch 622 is not an integer multiple of the sub-aperture pitch 642. In some embodiments, the sub-aperture pitch 642 does not extend across the boundaries of a pixel.

In some embodiments, the sub-aperture lenslet 640 side of the microlens array 602 is positioned closest to the VCSEL array 604. The pixel lenslet surface 634 is positioned furthest from the VCSEL array 602, with each lenslet 624, 626, 628, 630, 632 centered directly above a pixel. This positioning is specifically illustrated in FIG. 6, for example, for pixel lenslet 628 over pixel 610. The sub-aperture lenslets are centered directly above a sub-aperture. This is illustrated in FIG. 6, for example, for sub-aperture lenslet 640 above sub-aperture 644.

Figure 7A:
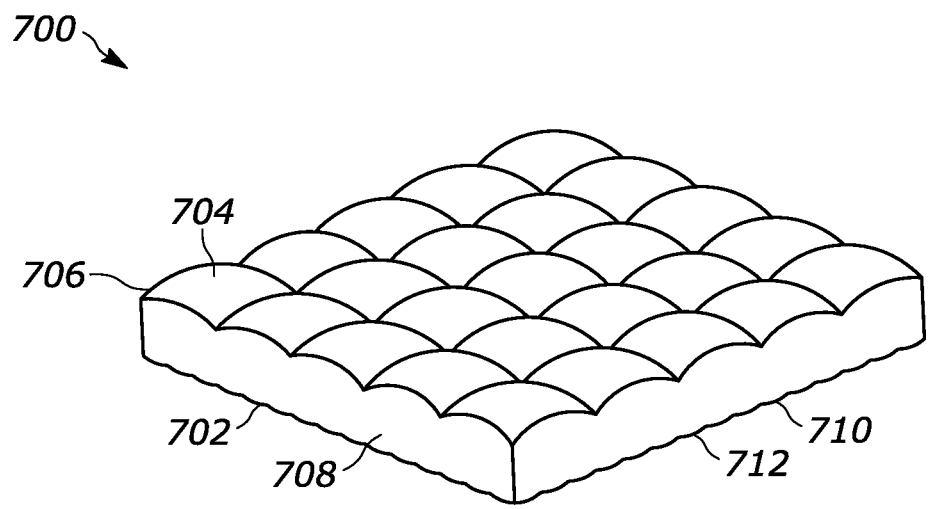
FIG. 7A illustrates a perspective view showing one side of an embodiment of a dual-sided microlens array of the present teaching.

FIG. 7A illustrates a perspective view 700 showing one side of an embodiment of a dual-sided microlens array 702 of the present teaching. Pixel lenslets 704 are formed on one surface 706 of the substrate 708. The lenslets 704 have a pitch that matches the pitch of, for example, a VCSEL array such that there is one lens per pixel in an embodiment of a transmit optical system of the present teaching. A 5×5 array of lenslets 704 is illustrated in the perspective view 700. The sub-aperture lenslets 712 are visible on the other surface 710 of the substrate 708.

Figure 7B:
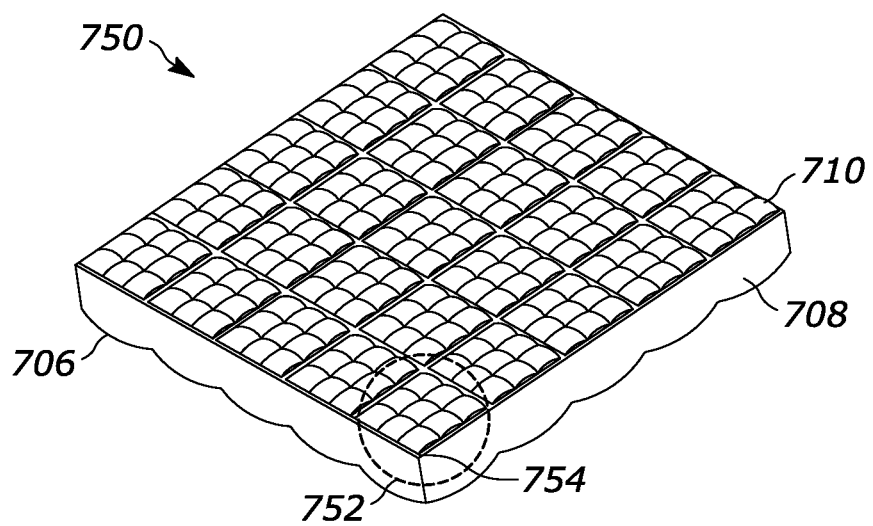
FIG. 7B illustrates a perspective view showing the other side of the embodiment of the dual-sided microlens array of FIG. 7A.

FIG. 7B illustrates a perspective view 750 showing the other side of the dual-sided microlens array of FIG. 7A. A circle 752 highlights a 9×9 array of sub-aperture lenslets 754 that are formed on the other surface 710 of the substrate. The sub-aperture lenslet 754 pitch is matched to the pitch of a matching array of lasers, for example, the sub-apertures of a VCSEL array. There are nine sub-aperture lenslets per pixel.

Figure 8:
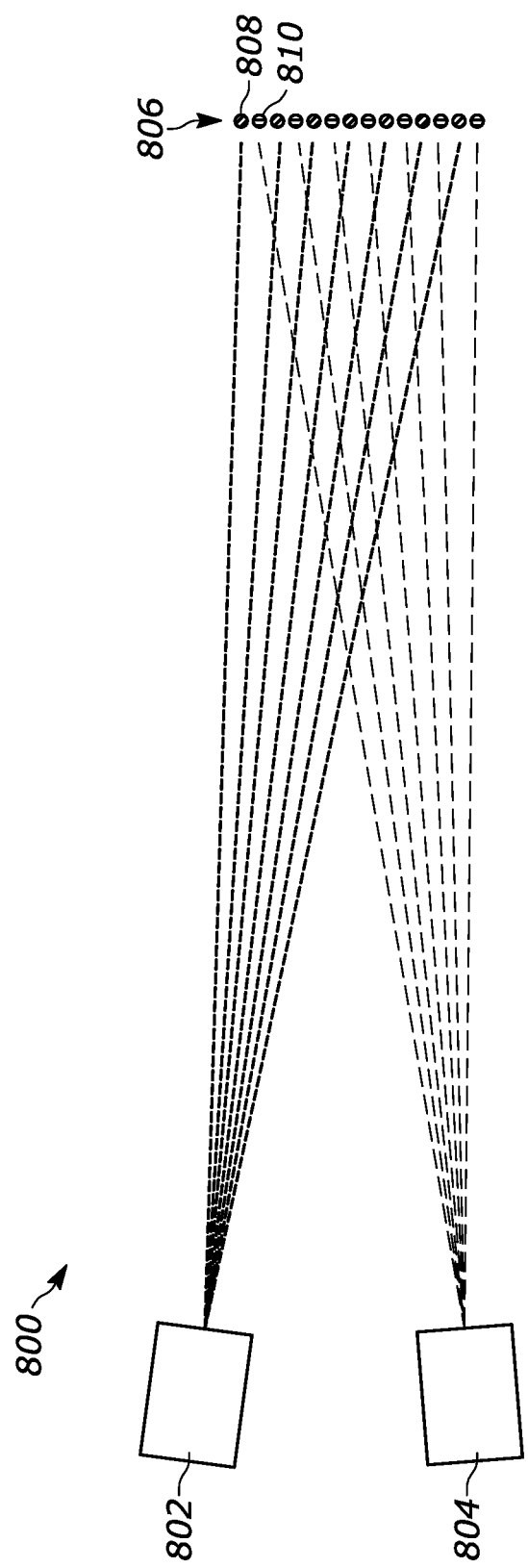
FIG. 8 illustrates an embodiment of a high-resolution LIDAR transmit system comprising multiple transmit optical systems of the present teaching.

FIG. 8 illustrates an embodiment of a high-resolution LIDAR transmit system 800 comprising multiple transmit optical systems 802, 804 of the present teaching. One feature of the present teaching is that the two microlens array configuration described herein makes it possible to use separate transmit optical systems that are aligned so that the total FOV generated by one transmit optical system 802 is offset by less than one pixel FOV from the total FOV generated by a second transmit optical system 804. This type of configuration can be referred to as an interleaved configuration. By interleaving the light from the two transmit optical systems 802, 804, the spatial resolution of the LIDAR system comprising the interleaved transmit system 800 is greatly improved compared with LIDAR systems that use only one transmit optical system.

The interleaving will have uniform spacing between spots generated by each of two different transmit optical systems (sometimes called perfect interleaving) at one target distance only. However, because the separation between the transmit optical systems 802, 804 can be small, in some embodiments separations are on the order of 10's of millimeters, and the target distances in some embodiments are on the order of 10's of meters, even imperfect interleaving is acceptable and improves resolution. Thus, improved resolution by interleaving the transmit optical systems 802, 804 is possible over a range of target distances using transmit optical systems of the present teaching. FIG. 8 shows the array of interleaved spots 806 at one target distance, illustrating the interleaving of a first array of spots 808 from transmit optical system 802 and a second array of spots 810 from transmit optical system 804.

Figure 9A:
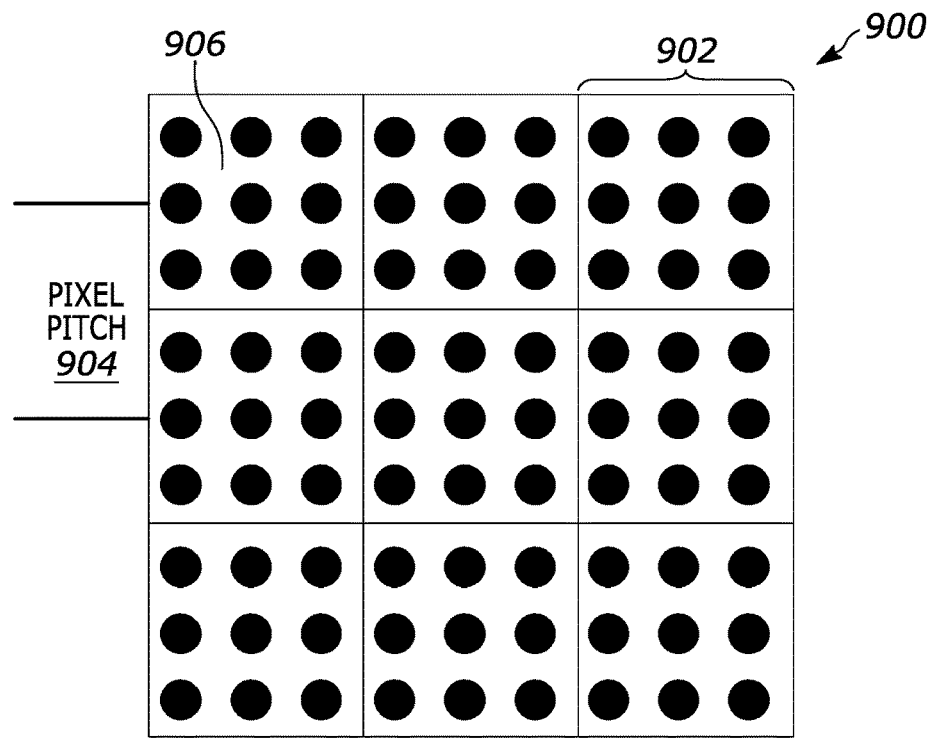
FIG. 9A illustrates a far field pattern for a single LIDAR transmitter using a system for projecting optical beams from a laser array that uses two conventional bulk lenses.

FIG. 9A illustrates a far field pattern 900 for a single solid-state LIDAR transmitter using a system for projecting optical beams from a laser array that uses two conventional bulk lenses, as illustrated in FIG. 3A. The pixel spot size 902 and pixel pitch 904 are nominally the same. The pixel spot size 902 is a full pixel. All the sub-aperture spots are illuminated by a control signal applied to energize that pixel and associated sub-apertures. As such, it is not possible to interleave pixel spots 906 from two different transmit optical systems that use only two bulk lenses and no microlenses. The pixel-spot-size-to-pixel-pitch in the far field is close to one for this system. As a result, there is no room to interleave the spots and provide an improved resolution by using two optical transmit systems.

Figure 9B:
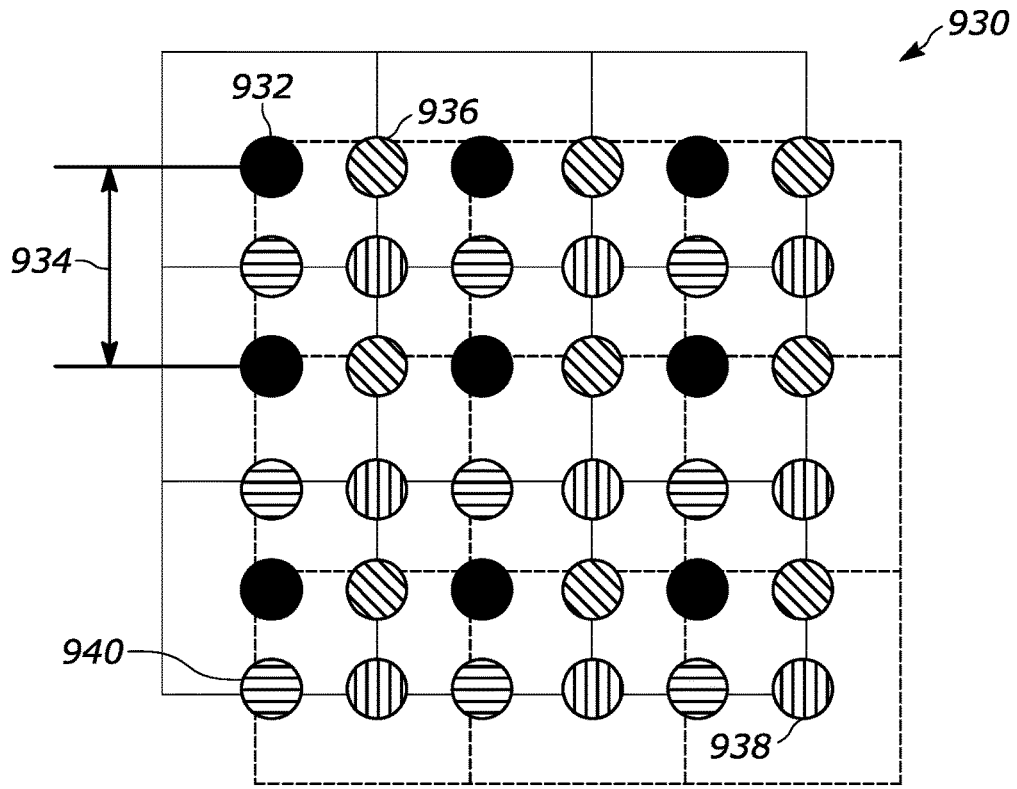
FIG. 9B illustrates a far field pattern for multiple interleaved LIDAR transmitters using a system for projecting optical beams from a laser array that uses one microlens array and one conventional bulk lens.

FIG. 9B illustrates a far field pattern 930 for multiple interleaved solid-state LIDAR transmitters using a system for projecting optical beams from a laser array that uses one microlens array and one conventional bulk lens, as illustrated, for example, in FIG. 4A. In this configuration, a spot size from a single energized pixel is shown as a shaded spot 932, which is smaller than the pixel FOV pitch 934. The ratio of pixel-spot-size-to-pixel-pitch in the far field is close to 0.5 for this system. Thus, in this case it is possible to interleave, e.g. four transmit optical systems. This produces four different pixel spots 932, 936, 938, 940 that are associated with the four different transmit optical systems. The interleaving of spots from four different transmit optical systems increases the spatial resolution by a factor of two in each dimension.

Figure 9C:
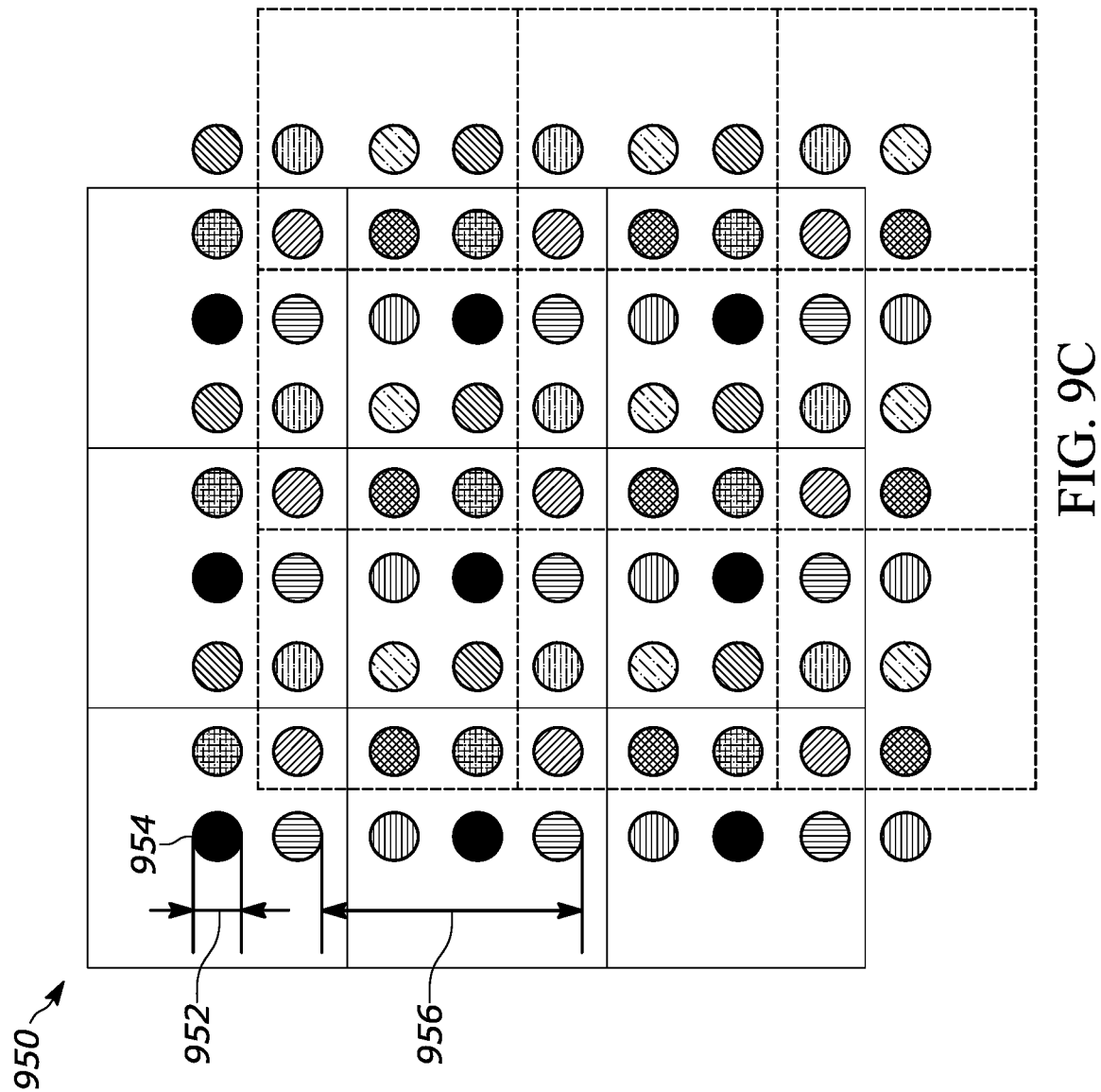
FIG. 9C illustrates a far field pattern for multiple interleaved LIDAR transmitters using an embodiment of a transmit optical system that projects optical beams from a laser array that uses two microlens arrays and one conventional bulk lens of the present teaching.

FIG. 9C illustrates a far field pattern 950 for multiple interleaved solid state LIDAR transmitters using an embodiment of a transmit optical system that projects optical beams from a laser array that uses two microlens arrays and one conventional bulk lens of the present teaching. This embodiment of the transmit optical system could be, for example, the embodiment shown in FIG. 5A. In this configuration, a pixel spot size 952 of a single pixel spot 954 is very small as compared to the pixel FOV pitch 956. In some embodiments, the ratio of pixel-spot-size-to-pixel-pitch in the far field is less than 0.1. It is possible to interleave spots 954 from at least nine transmit optical systems to increase spatial resolution. Different shades are used to illustrate pixel spots from different transmit optical systems.

The examples described in connection with FIGS. 9A-C illustrate far field patterns 900, 930, 950 generated by a VCSEL array with a 3×3 grid of pixels where each pixel includes a 3×3 grid of sub-apertures. Scaling to different array sizes and/or shapes for both pixels and/or sub-aperture sizes and/or shapes is a straightforward extension.

Thus, one feature of the transmit optical systems that utilize the combination of sub-aperture microlenses to focus optical beams from VCSEL pixel sub-aperture emitters, pixel microlenses to redirect the sub-aperture optical beams to their focus at an overlap point, and a bulk lens to project the sub-aperture beams in each pixel to a different angle in a far field is that it improves spatial resolution sufficiently to allow interleaving of transmit optical systems. This improvement is in part because a smaller far field pixel-spot-size-to-pixel-pitch ratio is achieved. The different projected angles in the far field are based on the position of a particular pixel optical beam with respect to the central, or principle axis of the bulk lens. Thus, by using bulk lenses with different focal lengths and positions, a variety of far-field projection angles can be achieved.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. A solid-state Light Detection and Ranging (LIDAR) transmitter comprising:
   a) a first transmit optical system comprising a first laser array and a first microlens array, a relative position of the first laser array and the first microlens array of the first transmit optical system configured to project a first plurality of optical beams generated by the first laser array to form a plurality of first pixel spots comprising a first spot size and a first pixel pitch at a target distance, thereby defining a first transmit optical system spatial resolution; and
   b) a second transmit optical system comprising a second laser array and a second microlens array, a relative position of the second laser array and the second microlens array of the second transmit optical system configured to project a second plurality of optical beams generated by the second laser array to form a plurality of second pixel spots comprising a second spot size and a second pixel pitch at the target distance, wherein the first transmit optical system and the second transmit optical system are positioned such that a total field-of-view generated by the first transmit optical system is offset by less than one pixel field-of-view from a total field-of-view generated by the second transmit optical system such that the plurality of first pixel spots is interleaved with the plurality of second pixel spots at the target range and wherein the first spot size and the second spot size are both smaller than a pixel pitch of the first transmit optical system so as to produce two separated pixel spots within a single pixel pitch of the first transmit optical system at the target distance such that a spatial resolution of the solid state LIDAR transmitter is greater than the first transmit optical system spatial resolution.

2. The solid-state LIDAR transmitter of claim 1 wherein the first laser array of the first transmit optical system and the second laser array of the second transmit optical system emit light at the same wavelength.

3. The solid-state LIDAR transmitter of claim 1 wherein the first laser array of the first transmit optical system and the second laser array of the second transmit optical system emit light at different wavelengths.

4. The solid-state LIDAR transmitter of claim 1 wherein the first pixel spots and the second pixel spots are the same size.

5. The solid-state LIDAR transmitter of claim 1 wherein the first pixel spots and the second pixel spots are different sizes.

6. The solid-state LIDAR transmitter of claim 1 wherein a pitch of the first microlens array is the same as a pitch of the first laser array.

7. The solid-state LIDAR transmitter of claim 1 wherein a pitch of the first microlens array is different from a pitch of the first laser array.

8. The solid-state LIDAR transmitter of claim 1 wherein the first transmit optical system further comprises a second microlens positioned between the first laser array and the first microlens array in an optical path of the first plurality of optical beams generated by the first laser array.

9. The solid-state LIDAR transmitter of claim 8 wherein a pitch of the second microlens is equal to a pitch of a sub-aperture array in the first laser array.

10. The solid-state LIDAR transmitter of claim 8 wherein the second microlens is on the same substrate as the first microlens array.

11. The solid-state LIDAR transmitter of claim 1 wherein the second transmit optical system further comprises a second microlens positioned between the second laser array and the second microlens array in an optical path of the second plurality of optical beams generated by the second laser array.

12. The solid-state LIDAR transmitter of claim 11 wherein a pitch of the second microlens is equal to a pitch of a sub-aperture array in the second laser array.

13. The solid-state LIDAR transmitter of claim 11 wherein the second microlens is on the same substrate as the second microlens array.

14. The solid-state LIDAR transmitter of claim 1 wherein the spatial resolution of the solid state LIDAR transmitter is twice the first transmit optical system spatial resolution.

* * * * *